United States Patent
Hirose et al.

(10) Patent No.: US 8,237,057 B2
(45) Date of Patent: Aug. 7, 2012

(54) WIRING BOARD AND WIRING BOARD MANUFACTURING METHOD

(75) Inventors: Takayuki Hirose, Osaka (JP); Norihito Tsukahara, Kyoto (JP); Manabu Gokan, Hyogo (JP)

(73) Assignee: Panasonic Corporation, Osaka (JP)

( * ) Notice: Subject to any disclaimer, the term of this patent is extended or adjusted under 35 U.S.C. 154(b) by 437 days.

(21) Appl. No.: 12/486,000

(22) Filed: Jun. 17, 2009

(65) Prior Publication Data

US 2009/0314528 A1 Dec. 24, 2009

(30) Foreign Application Priority Data

Jun. 24, 2008 (JP) ................................. 2008-165055

(51) Int. Cl.
H05K 1/09 (2006.01)
B05D 5/12 (2006.01)
B05D 3/10 (2006.01)
B32B 38/14 (2006.01)

(52) U.S. Cl. ...... 174/256; 427/97.3; 427/97.4; 156/277; 977/773

(58) Field of Classification Search .................... 174/256
See application file for complete search history.

(56) References Cited

U.S. PATENT DOCUMENTS

| | | | |
|---|---|---|---|
| 6,465,742 B1* | 10/2002 | Hiraoka et al. | ............... 174/255 |
| 7,356,921 B2* | 4/2008 | Furusawa et al. | ............... 29/846 |
| 2002/0164467 A1* | 11/2002 | Kawashima et al. | ......... 428/209 |
| 2003/0213614 A1 | 11/2003 | Furusawa et al. | |
| 2004/0191497 A1* | 9/2004 | Hiraoka et al. | ............ 428/304.4 |
| 2006/0115983 A1* | 6/2006 | Fujii et al. | ..................... 438/640 |
| 2006/0116000 A1* | 6/2006 | Yamamoto | .................... 438/795 |
| 2009/0087548 A1* | 4/2009 | Kim et al. | .................... 427/98.4 |

FOREIGN PATENT DOCUMENTS

| | | |
|---|---|---|
| JP | 2004-006578 A | 1/2004 |
| JP | 2007-123507 A | 5/2007 |

* cited by examiner

Primary Examiner — Timothy Thompson
Assistant Examiner — Hiram E Gonzalez
(74) Attorney, Agent, or Firm — RatnerPrestia

(57) ABSTRACT

A wiring board is provided that suppresses spreading of liquid droplets when liquid droplets are discharged using an ink-jet method. The wiring board has a plurality of layers and includes an ink-jet wiring pattern that is formed in a soluble porous membrane member of any single layer and that includes electrically conductive nanoparticles as a principal material, and a transferred wiring pattern that does not include electrically conductive nanoparticles as a principal material. One layer among the plurality of layers is an electrically insulative substrate. Another layer among the plurality of layers is a porous membrane treated member layer including a porous membrane member at one part of a region of the other layer. The ink-jet wiring pattern is formed in the porous membrane treated member layer. The transferred wiring pattern is formed in the substrate.

22 Claims, 23 Drawing Sheets

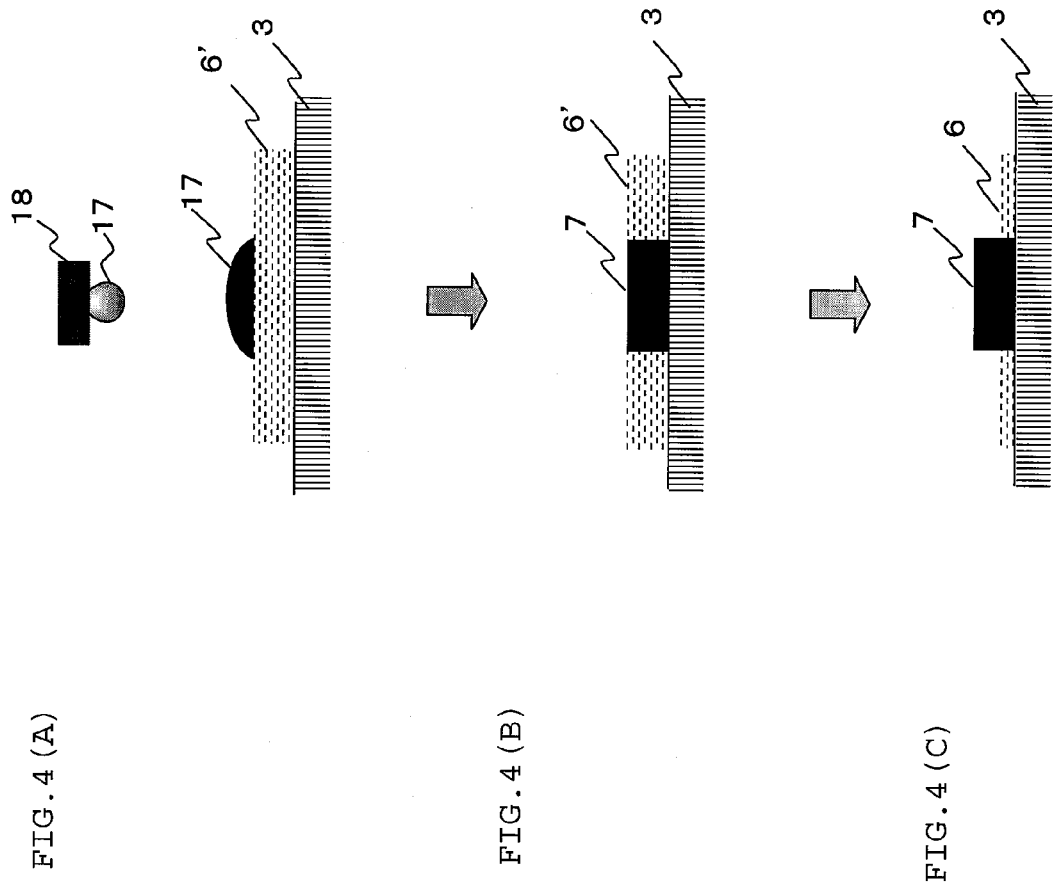

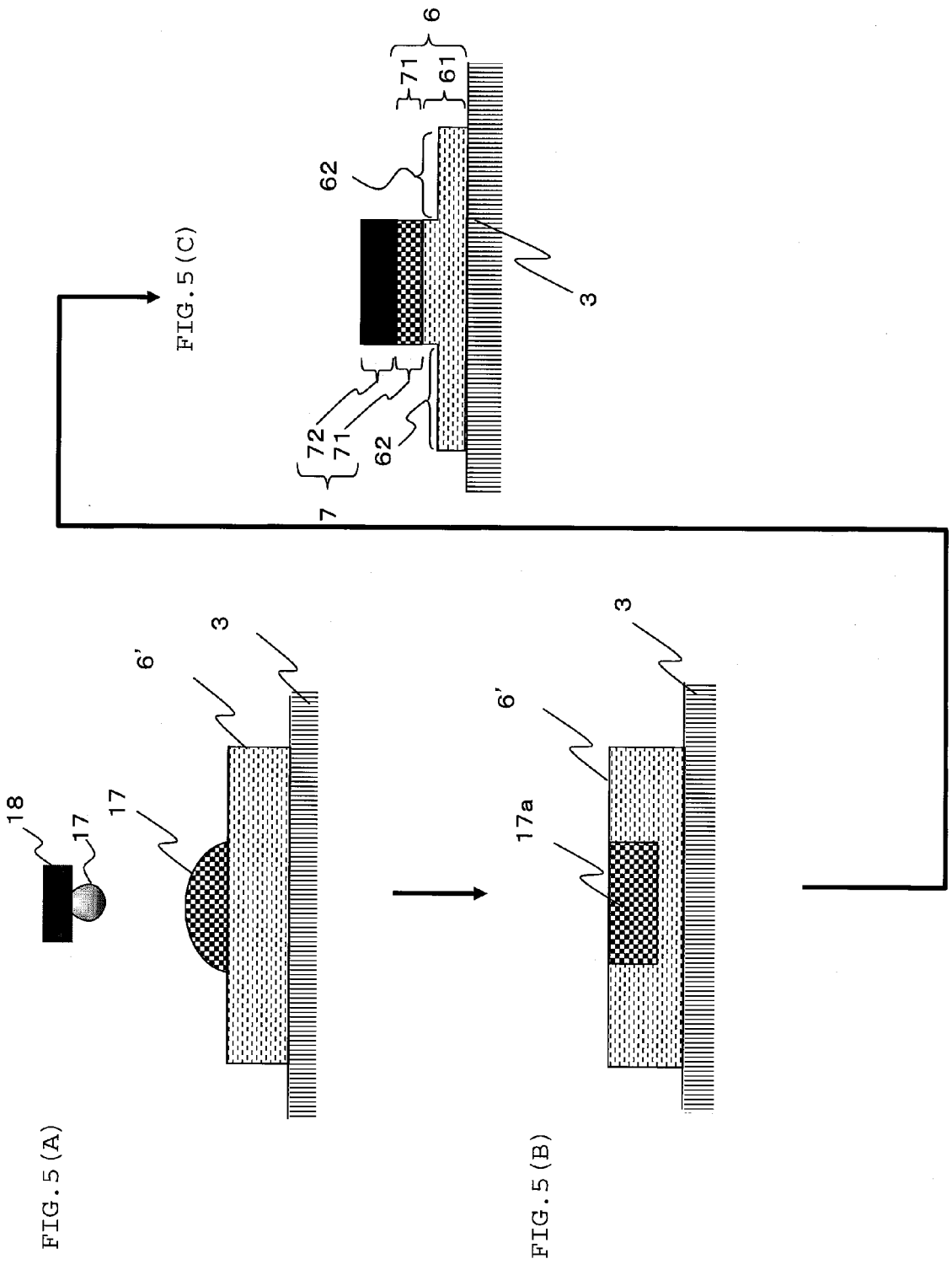

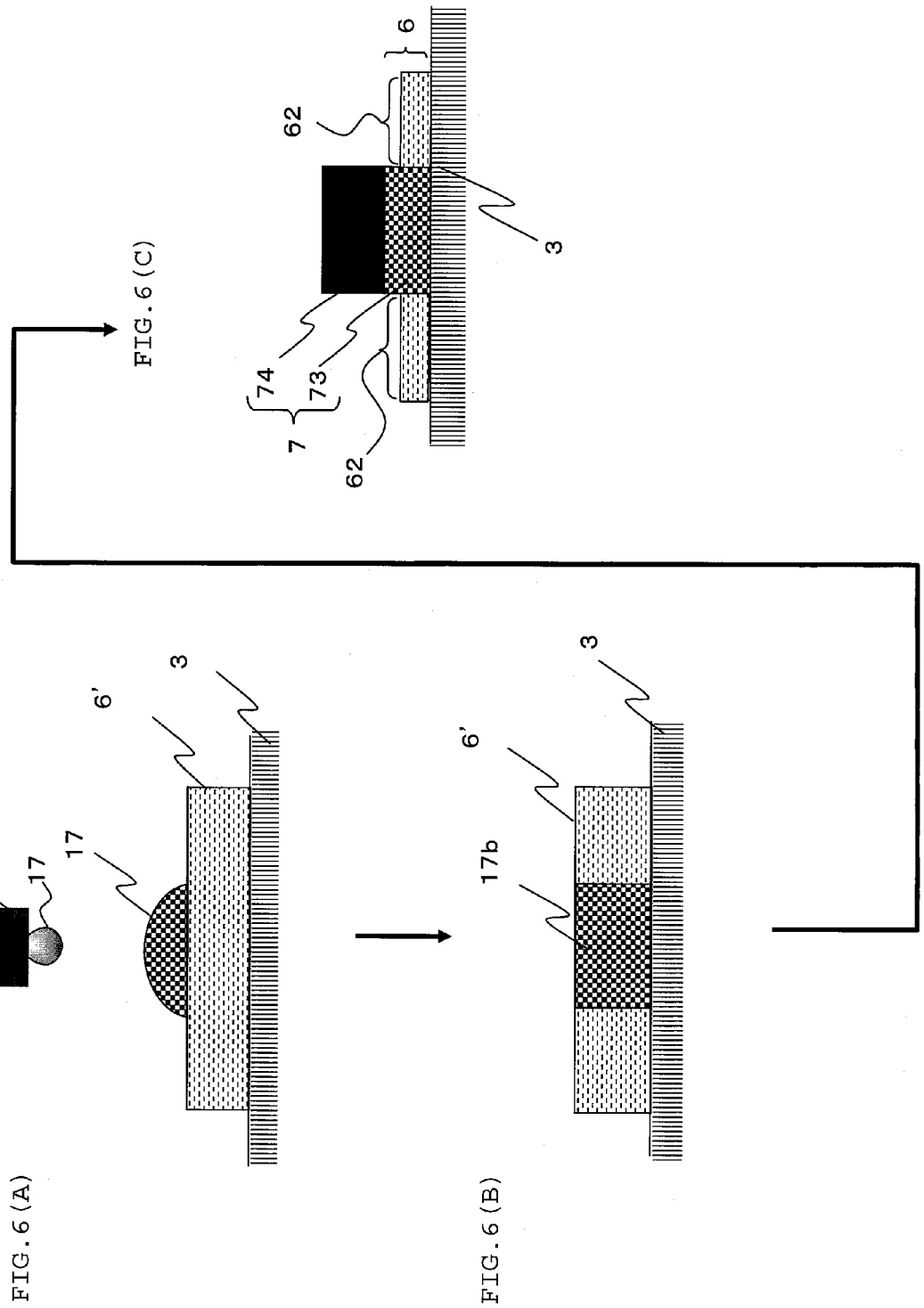

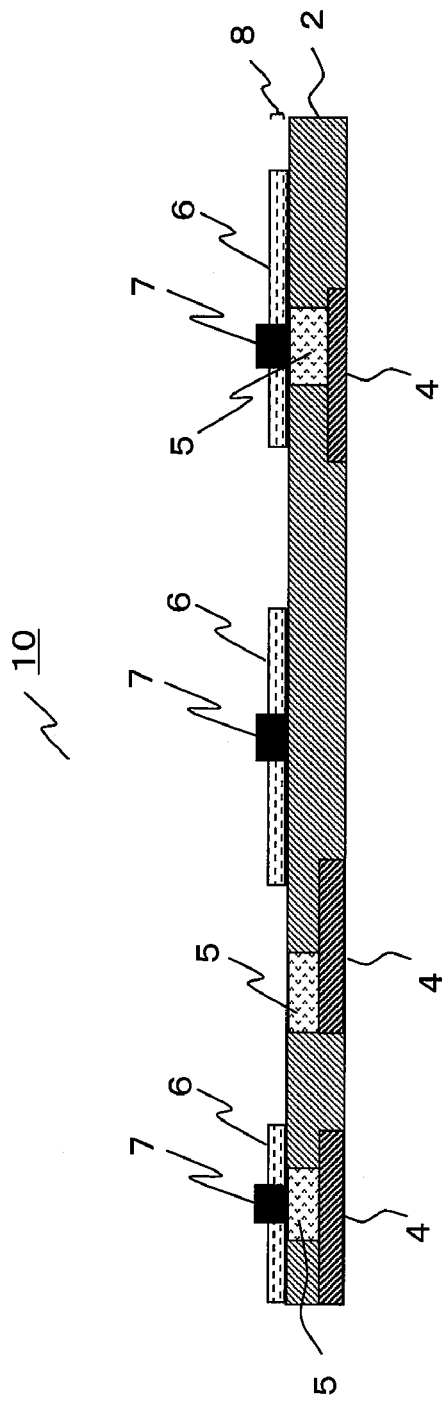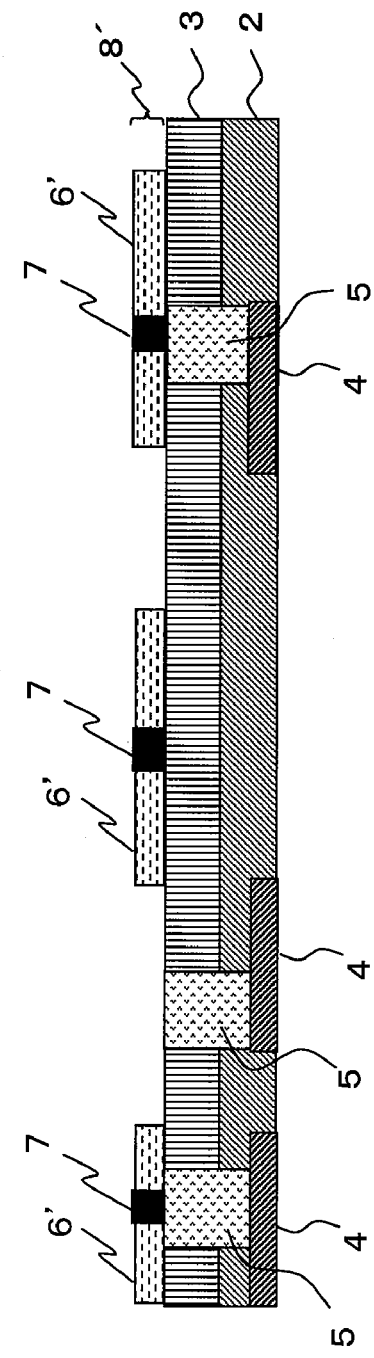

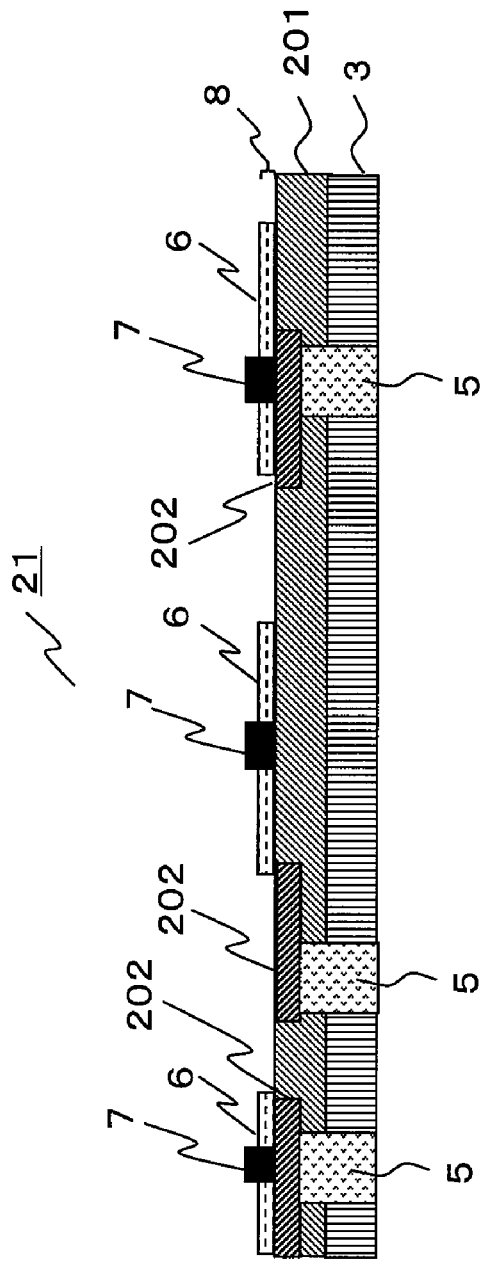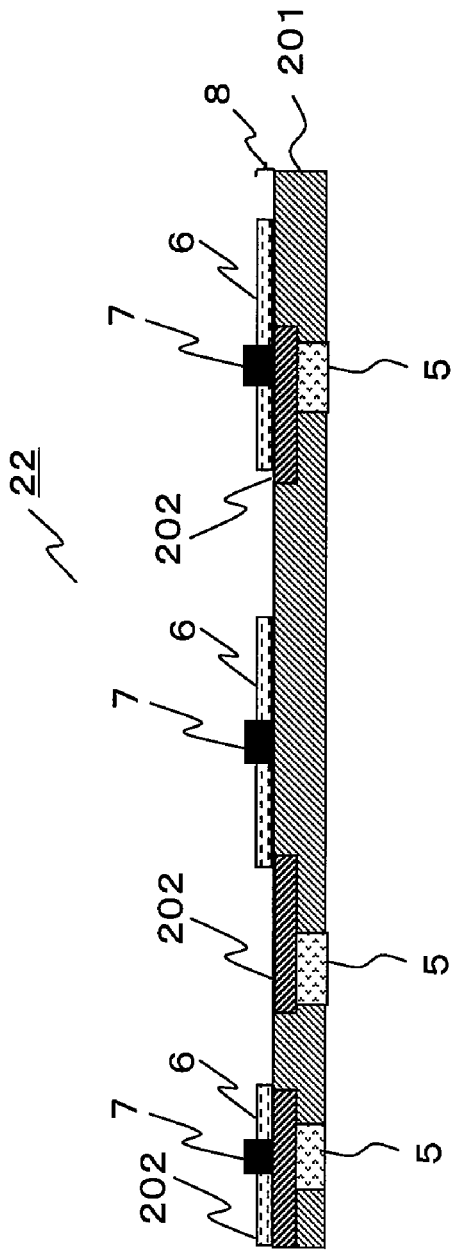
FIG. 13 (A)
FIG. 13 (B)

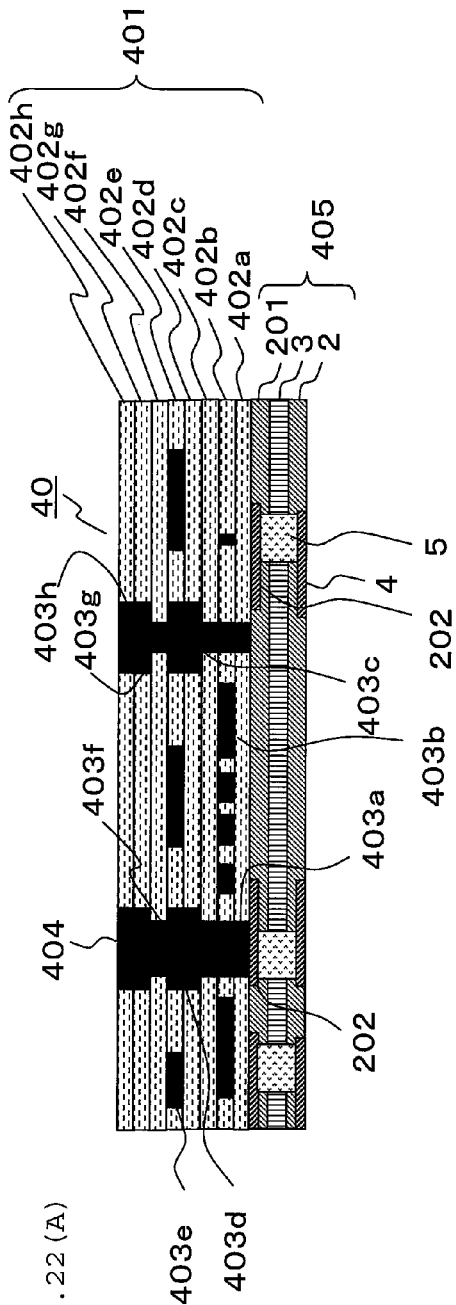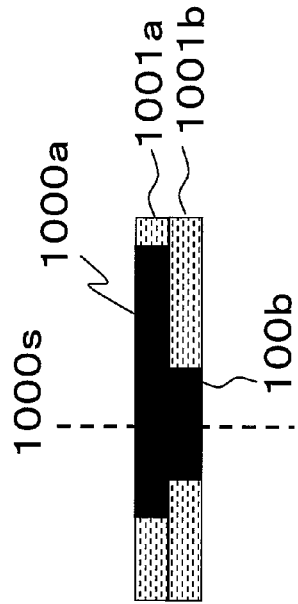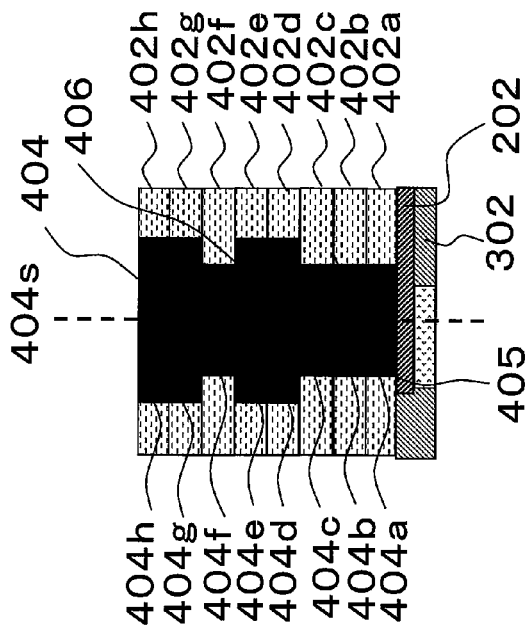
FIG. 22 (A)
FIG. 22 (C)
FIG. 22 (B)

WIRING BOARD AND WIRING BOARD MANUFACTURING METHOD

BACKGROUND OF THE INVENTION

1. Field of the Invention

The present invention relates to a wiring board and a wiring board manufacturing method.

2. Related Art of the Invention

Accompanying the miniaturization, thinning, and advanced functions of electronic devices in recent years, there is an increasingly stronger demand for high-density mounting of electronic components that are to be mounted on printed wiring boards, higher functionality of wiring boards on which electronic components are mounted, and miniaturization of wiring boards on which electronic components are mounted. In these circumstances, the wiring that is formed on the wiring boards is becoming more minute.

However, for example in the case of using screen printing or the like, it has been difficult to create minute wiring.

To solve this problem, a method has been disclosed that forms wiring patterns by selecting an ink-jet method for wiring pattern regions in which a wiring line interval or a wiring line width is not more than 50 μm, and selecting a screen printing method for wiring pattern regions in which a wiring line interval or a wiring line width is greater than 50 μm (for example, see Japanese Patent Laid-Open No. 2007-123507). According to the ink-jet method, wiring lines are formed by discharging electrically conductive nanoparticle paste that includes metal particles with a nano-order particle size distribution.

The entire disclosure of Japanese Patent Laid-Open No. 2007-123507 is incorporated herein by reference in its entirety.

SUMMARY OF THE INVENTION

However, when an ink-jet method is used, it is necessary to set the viscosity of the electrically conductive nanoparticle paste that is discharged to a low viscosity in order to prevent the nozzle from blocking up, and hence there is the problem that the electrically conductive nanoparticle paste that is discharged onto a substrate spreads out, and thus the lines of a wiring pattern can only be formed at a width that is significantly greater than the diameter of the liquid droplets.

Further, because the electrically conductive nanoparticle paste that is discharged spreads after landing in a spot shape on the surface of a substrate, wiring lines can only be formed with a thickness of several microns. Wiring lines that are formed in that manner cannot absorb a stress produced by a thermal shock or vibrations by plastic deformation, and hence a sufficient conductive adhesive strength can no longer be obtained. Further, when wiring lines are thin, the problem arises that the resistance value thereof increases and a loss when transmitting signals or the like increases.

The present invention has been made in consideration of the conventional wiring board problems, and an object of the invention is to provide a wiring board and a wiring board manufacturing method that are capable of suppressing the spreading of liquid droplets discharged by an ink-jet method.

The $1^{st}$ aspect of the present invention is a wiring board that has a single layer or a plurality of layers, comprising:

a first wiring pattern that includes electrically conductive nanoparticles as a principal material and is formed in a soluble porous membrane member of any single layer; and a second wiring pattern that does not include the electrically conductive nanoparticles as a principal material.

The $2^{nd}$ aspect of the present invention is the wiring board according to the $1^{st}$ aspect of the present invention, wherein:

a single layer among the plurality of layers is an electrically insulative substrate;

an another single layer among the plurality of layers is a porous membrane member layer that includes the porous membrane member in all or one part of a region of the another single layer;

the first wiring pattern is formed in the porous membrane member layer; and the second wiring pattern is formed on at least any one surface of the substrate.

The $3^{rd}$ aspect of the present invention is the wiring board according to the $2^{nd}$ aspect of the present invention, wherein the porous membrane member layer is disposed on a surface of the substrate or on a surface of a different other single layer among the plurality of layers, on which the second wiring pattern is not formed.

The $4^{th}$ aspect of the present invention is the wiring board according to the $2^{nd}$ aspect of the present invention, wherein the porous membrane member layer is disposed on a surface of the substrate on which the second wiring pattern is formed.

The $5^{th}$ aspect of the present invention is the wiring board according to the $3^{rd}$ aspect of the present invention, wherein:

the porous membrane member layer is disposed on a surface of a different other single layer among the plurality of layers, on which the second wiring pattern is not formed;

a different other single layer among the plurality of layers is formed by a film substrate that is formed with an organic film;

the porous membrane member layer is disposed on one surface of the film substrate;

the substrate is disposed on another surface of the film substrate; and the second wiring pattern is formed on a surface of the substrate on an opposite side to the film substrate.

The $6^{th}$ aspect of the present invention is the wiring board according to the $4^{th}$ aspect of the present invention, wherein:

a different other single layer among the plurality of layers is an electrically insulative substrate that is provided adjoining the substrate or is provided in a condition in which one or a plurality of layers are sandwiched between the different other single layer and the substrate; and a further different other single layer among the plurality of layers is a porous membrane member layer that includes a porous membrane member in all or a part of a region of the further different other single layer;

the wiring board further comprising:

a first wiring pattern formed in a porous membrane member layer that is the further different other single layer; and a second wiring pattern that is formed in a substrate that is the different other single layer;

wherein the two porous membrane member layers are disposed so as to sandwich the two substrates.

The $7^{th}$ aspect of the present invention is the wiring board according to the $6^{th}$ aspect of the present invention, wherein, to suppress warpage caused by temperature fluctuations, the two porous membrane member layers include porous membrane members for which coefficients of thermal expansion are different.

The $8^{th}$ aspect of the present invention is the wiring board according to the $2^{nd}$ aspect of the present invention, wherein:

the wiring board is bent around a bending section; and the porous membrane member layer is formed using the porous membrane member that is provided at parts excluding a vicinity of the bending section.

The 9th aspect of the present invention is the wiring board according to the 1st aspect of the present invention, wherein:

the second wiring pattern is formed in an identical layer to the first wiring pattern; and the identical layer is formed by the porous membrane member.

The 10th aspect of the present invention is the wiring board according to the 1st aspect of the present invention, wherein:

the second wiring pattern is formed in an identical layer to the first wiring pattern;

the identical layer is formed by an electrically insulative substrate;

the second wiring pattern is provided in the substrate so that a surface thereof and a surface of the substrate are positioned on a substantially same plane; and the first wiring pattern is formed in the porous membrane member that is disposed in a concave section provided in a surface of the substrate.

The 11th aspect of the present invention is the wiring board according to the 2nd aspect of the present invention, wherein a different other single layer among the plurality of layers is formed by an ultraviolet-curing resin.

The 12th aspect of the present invention is the wiring board according to the 2nd aspect of the present invention, wherein all or a part of the first wiring pattern is used as an interlayer connection via that electrically connects wiring patterns formed in two layers that sandwich the porous membrane member layer.

The 13th aspect of the present invention is the wiring board according to the 2nd aspect of the present invention, wherein a predetermined number of layers that are adjacently disposed among the plurality of layers are the porous membrane member layer.

The 14th aspect of the present invention is the wiring board according to the 13th aspect of the present invention, wherein at least one part of wiring portions of first wiring patterns in the predetermined number of porous membrane member layers that are adjacently disposed are formed so that centers in a width direction of the wiring portions are positioned on a substantially same straight line.

The 15th aspect of the present invention is the wiring board according to the 14th aspect of the present invention, wherein widths of the wiring portions that are formed in the respective porous membrane member layers are substantially the same.

The 16th aspect of the present invention is the wiring board according to the 14th aspect of the present invention, wherein:

widths of the wiring portions between the porous membrane member layers that are adjacent are formed so as to be substantially the same or to become larger in a direction from a first predetermined porous membrane member layer towards a second predetermined porous membrane member layer among the predetermined number of porous membrane member layers;

a width of the wiring portion that is formed in a third predetermined porous membrane member layer that is disposed adjoining a surface opposite the first predetermined porous membrane member layer side of the second predetermined porous membrane member layer is not more than a width of the wiring portion formed in the first predetermined porous membrane member layer; and widths of the wiring portions between the porous membrane member layers that are adjoining are formed so as to be substantially the same or to become larger in a direction from the third predetermined porous membrane member layer towards a fourth predetermined porous membrane member layer that is disposed on an opposite side to the second predetermined porous membrane member layer.

The 17th aspect of the present invention is the wiring board according to the 13th aspect of the present invention, wherein a cavity is formed in at least any one porous membrane member layer among the predetermined number of porous membrane members.

The 18th aspect of the present invention is the wiring board according to the 17th aspect of the present invention, wherein the cavity is formed adjacent to one part of wiring portions of the first wiring pattern.

The 19th aspect of the present invention is the wiring board according to the 18th aspect of the present invention, wherein:

at least one part of wiring portions of a first wiring pattern in the predetermined number of porous membrane member layers that are adjacently disposed are formed so that centers in a width direction of the wiring portions are positioned on a substantially same straight line;

the one part of wiring portions of the first wiring pattern to which the cavity is adjacent is the one part of wiring portions of a first wiring pattern that are formed so that centers in the width direction are positioned on a substantially same straight line;

a width of the wiring portions to which the cavity is adjacent is smaller than a width of the wiring portion formed in at least one porous membrane member layer that is adjacent to a porous membrane member layer in which the cavity is formed; and the cavity is also adjacent to the wiring portion formed in the at least one porous membrane member layer that is adjacent.

The 20th aspect of the present invention is the wiring board according to any one of the 1st aspect of the present invention to the 19th aspect of the present invention, wherein the second wiring pattern is formed in a layer such that a surface thereof and a surface of the layer in which the second wiring pattern is formed are positioned on a substantially same plane.

The 21st aspect of the present invention is the wiring board according to any one of the 1st aspect of the present invention to the 19th aspect of the present invention, wherein the second wiring pattern is formed so that a surface thereof protrudes from a surface of a layer in which the second wiring pattern is formed.

The 22nd aspect of the present invention is the wiring board according to any one of the 1st aspect of the present invention to the 19th aspect of the present invention, wherein the porous membrane member includes polyamide-imide or polyetherimide as a principal component.

The 23rd aspect of the present invention is the wiring board according to any one of the 1st aspect of the present invention to the 19th aspect of the present invention, wherein the electrically conductive nanoparticles are nanoparticles of a material selected from the group consisting of gold, silver, and copper.

The 24th aspect of the present invention is the wiring board according to any one of the 1st aspect of the present invention to the 8th aspect of the present invention, the 10th aspect of the present invention, and the 11th aspect of the present invention, wherein:

the first wiring pattern has at least a first electrically conductive nanoparticle layer and a second electrically conductive nanoparticle layer;

the first electrically conductive nanoparticle layer occupies all or a part of a thickness direction of the porous membrane member; and the second electrically conductive nanoparticle layer is positioned on the porous membrane member.

The 25th aspect of the present invention is a method of manufacturing a wiring board that has a single layer or a plurality of layers, comprising:

a first wiring pattern formation step which discharges a material including electrically conductive nanoparticles as a principal material onto a soluble porous membrane member using an ink-jet method to form a first wiring pattern on any one layer; and a second wiring pattern formation step which forms a second wiring pattern using a material that does not include the electrically conductive nanoparticles as a principal material.

The 26th aspect of the present invention is the method of manufacturing a wiring board according to the 25th aspect of the present invention, wherein:

a single layer among the plurality of layers is an electrically insulative substrate;

the second wiring pattern formation step is a transfer step which transfers the second wiring pattern onto the substrate using a transfer material that has the second wiring pattern; and a surface of the second wiring pattern becomes positioned on a substantially same plane as a surface of the substrate.

The 27th aspect of the present invention is the method of manufacturing a wiring board according to the 25th aspect of the present invention or the 26th aspect of the present invention, further comprising:

a treatment step of treating the porous membrane member with a predetermined solution after forming the first wiring pattern, to thereby reduce a thickness of the porous membrane member.

The 28th aspect of the present invention is the method of manufacturing a wiring board according to the 27th aspect of the present invention, wherein:

the porous membrane member includes polyamide-imide or polyetherimide as a principal component; and the predetermined solution is N-methyl-2-pyrrolidinone.

According to the present invention, there can be provided a wiring board and a wiring board manufacturing method that are capable of suppressing the spreading of liquid droplets discharged by an ink-jet method.

BRIEF DESCRIPTION OF THE DRAWINGS

FIGS. 4(A) to (C) are partially enlarged views for describing a method of manufacturing the wiring board 1 according to Embodiment 1 of the present invention;

FIGS. 5(A) to (C) are partially enlarged views for describing a method of manufacturing the wiring board 1 in a case of using polyetherimide as a porous membrane member according to Embodiment 1 of the present invention;

FIGS. 6(A) to (C) are partially enlarged views for describing a method of manufacturing the wiring board 1 in a case of using polyamide-imide as a porous membrane member according to Embodiment 1 of the present invention;

FIG. 7 is a sectional configuration diagram of a wiring board 10 as a modification example according to Embodiment 1 of the present invention;

FIG. 8 is a sectional configuration diagram of a wiring board 11 as a modification example according to Embodiment 1 of the present invention;

FIG. 13(A) is a sectional configuration diagram of a wiring board 21 as a modification example according to Embodiment 2 of the present invention, and FIG. 13(B) is a sectional configuration diagram of a wiring board 22 as a modification example according to Embodiment 2 of the present invention;

FIG. 22(A) is a sectional configuration diagram of a wiring board 40 according to Embodiment 4 of the present invention, FIG. 22(B) is a partially enlarged view of the wiring board 40 according to Embodiment 4 of the present invention, and FIG. 22(C) is a view that shows a modification example of the wiring board 40 according to Embodiment 4 of the present invention;

Figure 1:
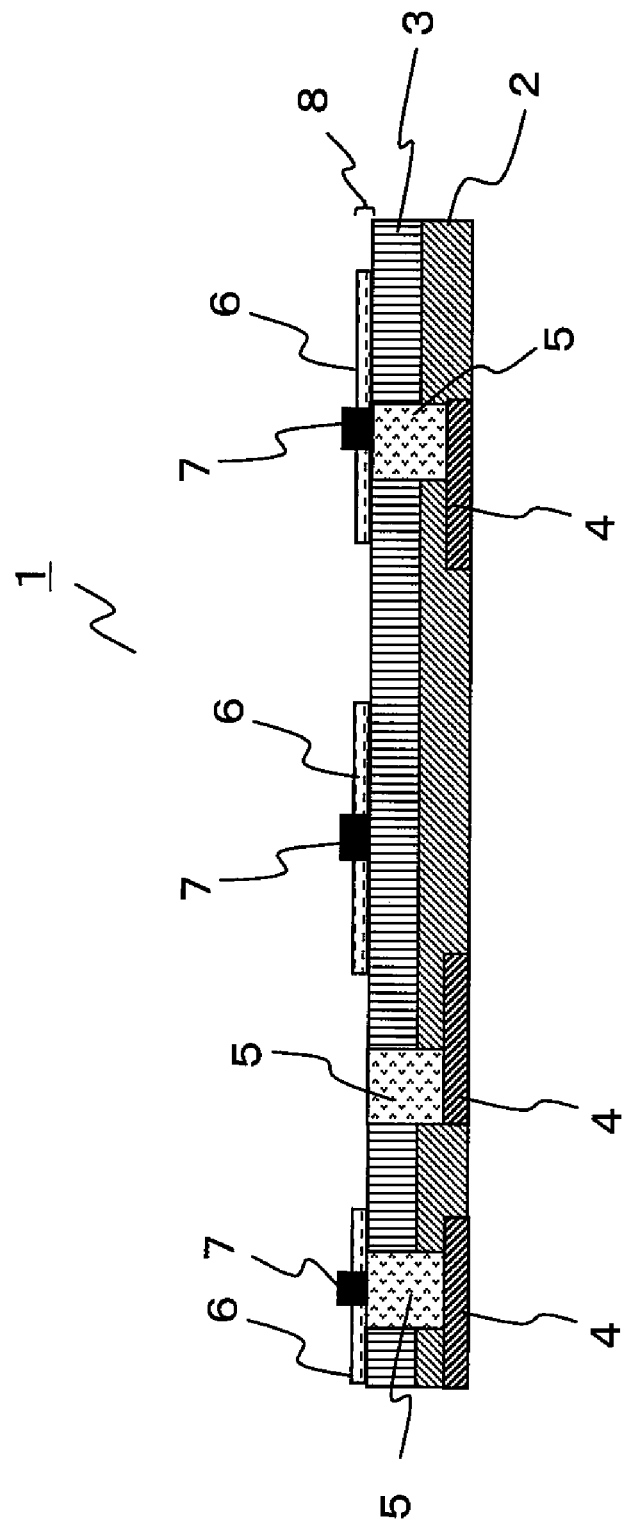
FIG. 1 is a sectional configuration diagram of a wiring board 1 according to Embodiment 1 of the present invention.

DESCRIPTION OF SYMBOLS 1, 10, 11, 12, 13, 14, 20, 21, 30, 31, 32, 33, 34, 35, 36, 37, 40, 41, 42, 50, 60 wiring board
2, 211, 201 substrate
3 film substrate
4, 214, 202 transferred wiring pattern
5 via
6', 37 porous membrane member
6, 121, 331, 332, 353, 363 porous membrane treated member
7, 333, 354, 364, 403a, 403b, 403c, 403d, 403e, 403f, 403g, 403h, 503e, 503g ink-jet wiring pattern
7a, 7a', 7b wiring portion
8 carrier sheet
15 dry film resist
16 mask
141 bending section
201, 202, 421, 422 multilayer board
352 wiring pattern
361 concave section
401, 423, 601 multilayer porous membrane substrate
402a, 402b, 402c, 402d, 402e, 402f, 402g, 402h, 602e, 602f porous membrane member layer
404, 411, 412 via
404a, 404b, 404c, 404d, 404e, 404f, 404g, 404h wiring portion
405 board
501 multilayer board
502e, 502g ultraviolet-curing resin layer
604, 605, 606, 607 cavity

PREFERRED EMBODIMENTS OF THE INVENTION

Hereunder, embodiments of the present invention are described referring to the drawings. In the following description, for the purpose of conciseness, constituent elements that have substantially the same function are denoted by the same reference number.

Embodiment 1

A wiring board according to Embodiment 1 of the present invention is described hereunder. According to Embodiment 1, the structure of a wiring board on which an ink-jet wiring pattern is formed on a surface of a substrate or on a surface of another layer, on which a wiring pattern is not formed by a method (for example, a transfer method) other than an ink-jet method is described.

FIG. 1 is sectional configuration diagram of a wiring board 1 according to the present embodiment. As shown in FIG. 1, the wiring board 1 according to the present embodiment includes a film substrate 3 that is formed from an organic film, and a tabular substrate 2 that includes a thermosetting resin that is provided on one side of the film substrate 3.

A transferred wiring pattern 4 is formed on a surface on the opposite side to the film substrate 3 of the substrate 2. The surface of the transferred wiring pattern 4 is exposed, and the transferred wiring pattern 4 is embedded in the substrate 2 so as to be on substantially the same plane as the surface of the substrate 2.

Further, porous membrane treated members 6 (described in detail later) that are formed by treating porous membrane members 6' with a predetermined solution are provided at a plurality of locations on the surface of the film substrate 3. An ink-jet wiring pattern 7 that is formed by penetration of an electrically conductive nanoparticle paste that is discharged by an ink-jet method is formed in the plurality of porous membrane treated members 6. The wiring board 1 of the present embodiment comprises a porous membrane treated member layer 8 that includes the plurality of porous membrane treated members 6 that are arranged at intervals, and has three layers that consist of a layer formed with the substrate 2, a layer formed with the film substrate 3, and the porous membrane treated member layer 8. In this connection, although according to the present embodiment the porous membrane treated members 6 are provided at intervals at multiple locations on the surface of the film substrate 3, even in a case in which a porous membrane treated member 6 is partially disposed at only one location, it is assumed that a single porous membrane treated member layer 8 is formed.

The surface of the ink-jet wiring pattern 7 protrudes more than the surface of the porous membrane treated member 6. The surface of the ink-jet wiring pattern 7 is subjected to plating, and the electronic components are mounted by soldering.

Vias 5 for electrically connecting the wiring of the transferred wiring patterns 4 and the wiring of the ink jet wiring patterns 7 are formed in the substrate 2 and the film substrate 3.

According to the present embodiment, the ink-jet wiring patterns 7 includes a pattern in which the width of wiring lines and the space between adjacent wiring lines are more minute than in the case of the transferred wiring pattern 4. For example, the transferred wiring pattern 4 is used for a wiring pattern in which the width of and interval between wiring lines is greater than 20 μm, and the ink-jet wiring pattern 7 is used for a wiring pattern including a section in which the width of and interval between wiring lines is less than 20 μm.

In this connection, although according to the present embodiment an epoxy resin is used as the thermosetting resin of the above described substrate 2, the thermosetting resin may be a polyimide resin or an acrylic resin or the like. As one example, the thickness of the substrate 2 is set to 10 μm.

It is sufficient to use a material having electrical conductivity as the wiring lines of the aforementioned transferred wiring pattern 4, and although copper foil is used according to the present embodiment, for example, the wiring lines may be formed by gold, silver, nickel or the like. As one example, the thickness of the wiring lines of the transferred wiring pattern 4 is set to 5 μm.

The aforementioned film substrate 3 is formed with an organic film such as a resin that has insulating properties. Although a polyimide is used as the organic film according to the present embodiment, the organic film may be a polyamide, polyethylene terephthalate, or the like. As one example, the thickness of the film substrate 3 is set to approximately 10 μm. As a substrate that is adjacent to the substrate 2, a substrate formed with a ceramic or the like may also be used not just a substrate formed with a flexible organic film such as the film substrate 3.

Although according to the present embodiment copper is used as the aforementioned via 5, nickel or silver or the like may also be used.

In this connection, an example of a first wiring pattern of the present invention corresponds to the ink-jet wiring pattern 7 of the present embodiment, and an example of a second wiring pattern of the present invention corresponds to the transferred wiring pattern 4 of the present embodiment. Further, an example of a film substrate of the present invention corresponds to the film substrate 3 of the present embodiment, and an example of a substrate of the present invention corresponds to the substrate 2 of the present embodiment. A porous membrane member of the present invention corresponds to the porous membrane member 6' or the porous membrane treated member 6 of the present embodiment, and an example of a porous membrane member layer of the present invention corresponds to the porous membrane treated member layer 8 of the present embodiment. Further, the term "region" according to the present invention, for example, corresponds to the size of the entire surface of the film substrate 3 according to the present embodiment.

Further, an example of "the porous membrane member layer is arranged on a surface of a different other single layer on which the second wiring pattern is not formed" corresponds to the porous membrane treated member layer 8 of the present embodiment being arranged on a surface of the film substrate 3. The film substrate 3 corresponds to one example of a "different other single layer" of the present invention. Furthermore, an example of "the second wiring pattern is formed on a surface of the substrate that is on the opposite side to the film substrate" corresponds to the transferred wiring pattern 4 of the present embodiment being formed on the surface of the substrate 2 on the side that is opposite to the side-on which the film substrate 3 is disposed.

Next, a method of manufacturing the wiring board 1 of the present embodiment is described. FIGS. 2(A) to (E) are views for describing a method of manufacturing the wiring board 1 of the present embodiment.

First, the substrate 2 is formed in a sheet shape by dropping a predetermined amount of a mixture of thermosetting resin, inorganic filler, or the like onto a mould releasing film, forming the mixture into a desired thickness by application of pressure and heating, and thereafter peeling off the substrate from the mould releasing film. In this connection, at the time of heating, a temperature (for example, 120° C.) that is lower than the curing temperature of the resin (for epoxy resin, the curing temperature is approximately 130° C.) is maintained so that the thermosetting resin enters a partially-curing set state.

Figure 2A:
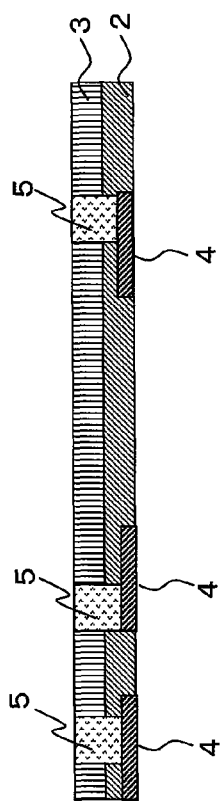
FIGS. 2(A) to (E) are views for describing a method of manufacturing the wiring board 1 according to Embodiment 1 of the present invention.

Subsequently, as shown in FIG. 2(A), the substrate 2 that is formed in a sheet shape and the film substrate 3 that is formed with an organic film are adhered together.

Figure 2B:
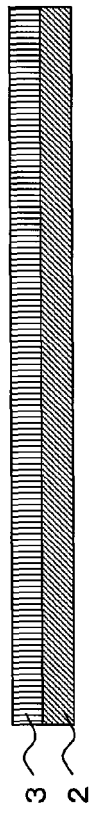

Next, as shown in FIG. 2(B), through-holes 5a are formed by laser processing or drill processing or the like in the substrates 2 and 3. An electrically conductive resin composition 5b that includes a material that has electrical conductivity, such as copper, is filled inside the through-holes 5a. A carbon dioxide gas laser, an excimer laser, a YAG laser or the like can be used for the laser processing.

Next, the transferred wiring pattern 4 is formed on the substrate 2 by a transfer method. The step of forming the transferred wiring pattern 4 is an example of a second wiring pattern formation step of the present invention, and that step is described hereunder together with a description of an example of a transfer step of the present invention.

Figure 2C:
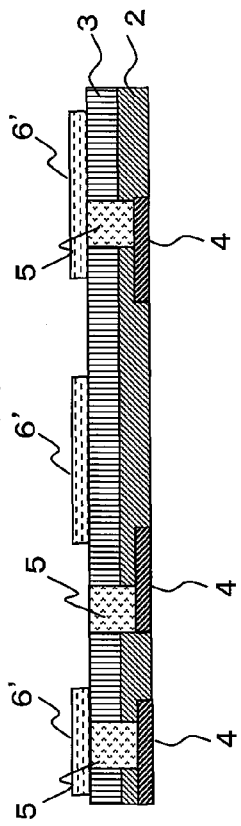

First, a carrier sheet 9 is prepared that corresponds to an example of a transfer material of the present invention as shown in FIG. 2(C).

Figure 3A:
FIGS. 3(A) to (D) are views for describing a method of manufacturing the wiring board 1 according to Embodiment 1 of the present invention.
Figure 3B:
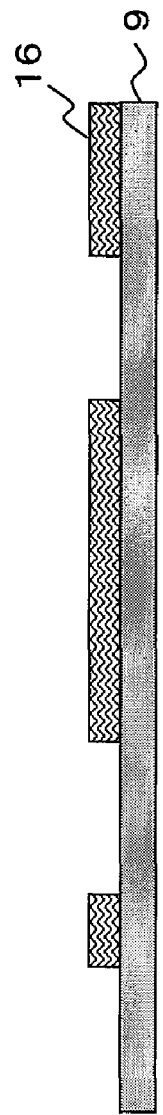
Figure 3C:
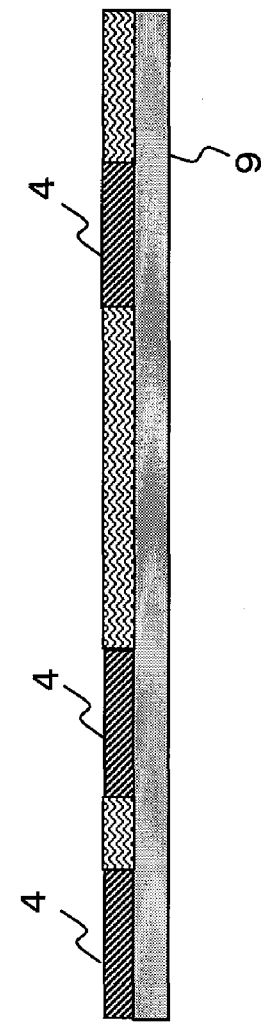
Figure 3D:

FIGS. 3(A) to (D) are views that illustrate a step of forming the transferred wiring pattern 4 on the carrier sheet 9. As shown in FIG. 3(A), an adhesive is coated on an electrolytic copper foil as the carrier sheet 9, and a dry film resist 15 used for a photolithography method is pasted thereon. Next, as shown in FIG. 3(B), by exposing and developing the dry film resist 15 in the shape of the transferred wiring pattern 4, a mask 16 is formed in which the resist remains at areas other than a section for the transferred wiring pattern 4. Next, as shown in FIG. 3(C), the transferred wiring pattern 4 comprising a copper foil is formed by electrolytic plating. Finally, as shown in FIG. 3(D), a member shown in FIG. 3(c) is immersed in a peeling liquid to remove the mask 16 and thereby form the carrier sheet 9 on which the transferred wiring pattern 4 is formed.

The carrier sheet 9 on which the transferred wiring pattern 4 is previously formed in this manner and the substrate 2 are adhered together by applying pressure thereto while heating. The heating temperature is set to a temperature that is lower than the curing temperature of the resin. Subsequently, after the transferred wiring pattern 4 has been embedded in the substrate 2 by heating and application of pressure, the carrier sheet 9 is peeled off to complete transfer of the transferred wiring pattern 4 (see FIG. 2(D)).

Figure 2D:
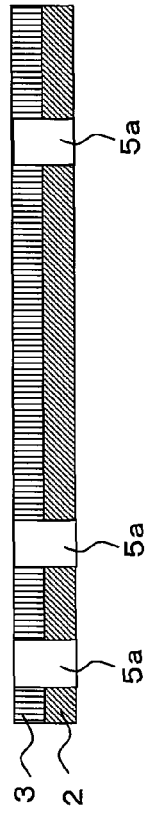

Next, the epoxy resin is completely hardened by heating the substrates 2 and 3 in the state shown in FIG. 2(D) at a temperature that is equal to or greater than the curing temperature of the resin. In this connection, the resin that is filled inside the through-holes 5a is also cured by the aforementioned heating, thus the vias 5 is formed.

Next, a step which forms the ink-jet wiring pattern 7 is described. The step which forms the ink-jet wiring pattern 7 corresponds to an example of a first wiring pattern formation step of the present invention.

Figure 2E:
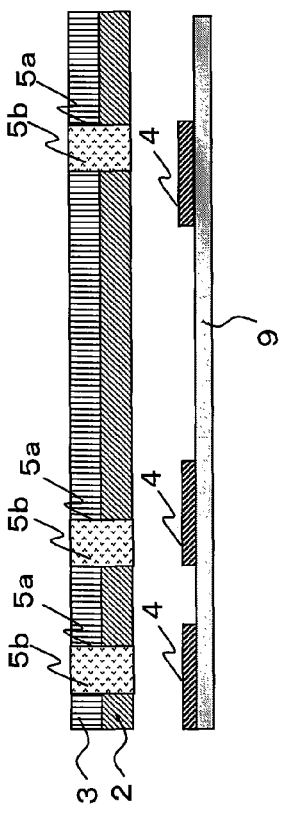

As shown in FIG. 2(E), sheet-shaped porous membrane members 6' comprising polyamide-imide or the like are affixed at a plurality of places on the surface of the film substrate 3.

The porous membrane member 6' is a porous membrane member that includes polyamide-imide or polyetherimide as a principal constituent and in which a large number of micropores that have a communicating property are present. In this connection, the polyamide-imide is a resin with thermosetting properties, and for example, a porous membrane member with a mean pore size of 0.5 μm, a porosity of 80%, and a membrane thickness of 25 μm is used. Further, the polyetherimide is a resin with thermoplastic properties, and a porous membrane member with a mean pore size of 2 μm, a porosity of 75%, and a membrane thickness of 25 μm is used. Furthermore, these sheet-shaped (also referred to as "film-shaped") porous membrane members are formed by a manufacturing method such as, for example, casting a polymer solution produced by dissolving a polyamide-imide-based resin or a polyetherimide-based resin in a sheet shape on a substrate, and thereafter solidifying and peeling off from the substrate.

Subsequently, electrically conductive nanoparticle paste 17 is discharged onto the porous membrane member 6' from a nozzle 18 so as to form a desired wiring pattern.

In this connection, the electrically conductive nanoparticles of the present invention are minute electrically conductive particles that have a mean particle size of 30 nm or less. The electrically conductive nanoparticle paste 17 that corresponds to an example of "a material including electrically conductive nanoparticles as a principal material" of the present invention is a substance in which these minute electrically conductive particles have been dispersed in a solvent. Although silver particles are used as the electrically conductive particles according to the present embodiment, particles formed with a metal such as copper or gold may also be used. As the solvent, tetradecane, toluene, water, ethanol or the like can be used.

FIGS. 4(A) to (C) are enlarged views of the vicinity of one part of the porous membrane member 6'. As shown in FIG. 4(A), the electrically conductive nanoparticle paste 17 is discharged from the nozzle 18 onto the surface of the porous membrane member 6'. The discharged electrically conductive nanoparticle paste 17 subsequently penetrates into the porous membrane member 6' (see FIG. 4(B)). In this case, since holes are formed in the porous membrane member 6', the discharged electrically conductive nanoparticle paste 17 penetrates into the holes and thus spreading thereof on the surface is suppressed. In this case, the penetration behavior can be controlled by selecting porous membrane members that have different thicknesses, selecting different ink (electrically conductive nanoparticle paste 17) dropping amounts, and porous membrane members that have different hole formation directions and the like. By controlling the penetration behavior in this manner, it is possible to control the width and thickness of wiring lines and the like.

After the electrically conductive nanoparticle paste 17 has penetrated into the holes, a framework (or wall surface) section forming the holes of the porous membrane member 6' is dissolved by impregnation with a predetermined solution to thereby form the porous membrane treated member 6 which has a thinner thickness overall (see FIG. 4(C)).

Finally, by heating (approximately 220° C.), the solution in which the electrically conductive nanoparticles are dispersed in the electrically conductive nanoparticle paste 17 is volatilized and baked to form the ink-jet wiring pattern 7.

In this connection, after the electrically conductive nanoparticle paste 17 has penetrated the holes, although the solution treatment may be performed after baking, in the case of using a porous membrane member that has a low heat resistance, it is preferable to perform baking after the solution treatment. This is because if baking is performed first when using a porous membrane member that has weak heat resistance, in some cases it is difficult to dissolve the porous membrane member by solution treatment.

Thus, since the thickness of the porous membrane member 6' becomes thinner when the solution treatment is performed, the surface of the ink-jet wiring pattern 7 protrudes more than the surface of the porous membrane treated member 6. The protruding portion is subjected to plating, and electronic components and the like are mounted thereon. In this connection, for the predetermined solution, for example, when the porous membrane member is polyamide-imide or polyetherimide, NMP (N-methyl-2-pyrrolidinone) is used. The thickness (denoted by reference numeral 62 in FIG. 5(C)) of the porous membrane member is decreased to a thickness that is approximately ⅕ of its original thickness, for example, from 20 µm to 4 µm, by the solution treatment using NMP. This step corresponds to an example of a treatment step of the present invention. Further, although, for example, a member that is soluble in NMP is used according to the present embodiment as a soluble porous membrane member of the present invention, the present invention is not limited thereto, and the soluble porous membrane member may be any member as long as the member is at least soluble in an organic solvent. In this connection, the soluble porous membrane member of the present invention is a member that does not include a ceramic green sheet.

As described above, according to the present embodiment, by affixing the porous membrane member 6' on the surface of the film substrate 3 and discharging the electrically conductive nanoparticle paste 17 thereon, the electrically conductive nanoparticle paste 17 penetrates into holes of the porous membrane member 6', and it is thereby possible to suppress spreading at the time of discharge. It is therefore possible to form a wiring pattern having a section in which the width of a wiring line or an interval between wiring lines is minute.

Further, since the spreading of liquid droplets at the time of discharge can be suppressed, it is possible to form a wiring pattern with a greater thickness than heretofore, and peeling or cracking or the like can be suppressed.

Although an overview of a step that forms the ink-jet wiring pattern 7 has been described in FIGS. 4(A) to (C), a step that forms the ink-jet wiring pattern 7 in a case that uses, for example, polyetherimide or polyamide-imide as the porous membrane member 6' will now be described in further detail using FIGS. 5 and 6.

For example, polyetherimide with a membrane thickness of approximately 25 µm is used as the porous membrane member 6', and the electrically conductive nanoparticle paste 17 in a spherical shape that has a diameter of approximately 40 µm is dropped by an ink-jet method on the polyetherimide (see FIG. 5(A)). Thereupon, as shown in FIG. 5(B), the electrically conductive nanoparticle paste 17 penetrates as far as a position that is partway through the thickness of the porous membrane member. The section of the porous membrane member 6' to which the electrically conductive nanoparticle paste 17 has penetrated is denoted by reference numeral 17a.

Subsequently, when baking is performed after solution treatment by NMP, the framework (or wall surface) section that forms the holes of the porous membrane member 6' dissolves to obtain the porous membrane treated member 6 in which the overall thickness has become thinner, and the penetrated section 17a has become the ink-jet wiring pattern 7 (see FIG. 5(C)). In this case, the thickness of the porous membrane member 6' at the penetrated section 17a also becomes thinner due to the solution treatment. Therefore, in the ink-jet wiring pattern 7 after the solution treatment, the porous membrane member 6' has disappeared from the top portion thereof and the top portion has become a second electrically conductive nanoparticle layer 72 formed by electrically conductive nanoparticles, and the bottom portion has become a first electrically conductive nanoparticle layer 71 that is formed by inclusion of electrically conductive nanoparticles in the material of the porous membrane member 6'. Further, because the electrically conductive nanoparticle paste 17 has only impregnated as far as a position that is partway through the thickness of the porous membrane member 6', on the lower side of the first electrically conductive nanoparticle layer 71 is formed a layer 6' that has as a principal constituent the material of the porous membrane member 6' that does not include the electrically conductive nanoparticle paste 17. In this connection, an example of "a first electrically conductive nanoparticle layer occupies one portion in a thickness direction of a porous membrane member" of the present invention corresponds to the first electrically conductive nanoparticle layer 71 of the ink-jet wiring pattern 7 occupying one portion in the thickness direction of the porous membrane treated member 6.

On the other hand, when polyamide-imide with a membrane thickness of approximately 25 µm is used as the porous membrane member 6' and, as shown in FIG. 6(A), the electrically conductive nanoparticle paste 17 in a spherical shape that has a diameter of approximately 40 µm is dropped by an ink-jet method onto the polyamide-imide, as shown in FIG. 6(B), the electrically conductive nanoparticle paste 17 penetrates across the entire thickness direction of the porous membrane member. This section that is penetrated by the electrically conductive nanoparticle paste 17 is denoted by reference numeral 17b.

Subsequently, similarly to the above described example, when baking is performed after solution treatment by NMP, the framework (or wall surface) section that forms the holes of the porous membrane member 6' dissolves to thereby obtain the porous membrane treated member 6 in which the overall thickness has become thinner. Further, the penetrated section 17b has become the ink-jet wiring pattern 7 (see FIG. 6(C)). The thickness of the porous membrane member at the section 17b also becomes thinner. Therefore, in the ink-jet wiring pattern 7 after the solution treatment, the porous membrane member 6' has disappeared from the top portion thereof and the top portion has become a second electrically conductive nanoparticle layer 74 formed by electrically conductive nanoparticles, and a bottom portion 73 has become a first electrically conductive nanoparticle layer 73 that is formed by inclusion of electrically conductive nanoparticles in the material of the porous membrane member 6'. In this connection, because the electrically conductive nanoparticle paste penetrates across the entire thickness direction of the porous membrane member 6', in comparison with the case of polyetherimide described above, a layer that is composed only by the material of the porous membrane member 6' is not formed on the lower side of the first electrically conductive nanoparticle layer 73. In this connection, an example of "a first electrically conductive nanoparticle layer occupies the entire thickness direction of a porous membrane member" of the present invention corresponds to the first electrically conductive nanoparticle layer 73 of the ink-jet wiring pattern 7 occupying the entire thickness direction of the porous membrane treated member 6.

Therefore, when comparing a case of using polyetherimide as the porous membrane member 6' and a case of using polyamide-imide as the porous membrane member 6', since the penetration range is less for the case of using polyetherimide in a case in which the same amount of the electrically conductive nanoparticle paste 17 is dropped, the density of electrically conductive nanoparticles in a cross section of the ink-jet wiring pattern 7 is more for the case of using polyetherimide. Therefore, when polyetherimide is used as the porous membrane member 6', the conductivity is greater in comparison to the use of polyamide-imide.

Results obtained after evaluating the diffusibility of a dispersion medium with respect to both polyetherimide porous membrane members 6' and polyamide-imide porous membrane members 6' will now be described.

One μL of tetradecane as a dispersion medium was dropped on a polyetherimide porous membrane member and a polyamide-imide porous membrane member, respectively, and the diameters after 600 seconds were measured. This measurement was repeated a plurality of times to obtain a mean diameter after 600 seconds. In this connection, the thickness of the porous membrane members was 25 μm, and the ambient temperature was 23.2° C.

The diameter immediately after dropping was approximately 2.5 mm for both polyetherimide and polyamide-imide. The mean diameter after 600 seconds was 7.09 mm for polyetherimide and 9.27 mm for polyamide-imide.

Thus, since liquid droplets that were dropped were less prone to spreading in the polyetherimide compared to the polyamide-imide, it can be said that the diffusibility of polyetherimide is smaller. Therefore, it can be presumed that the density of electrically conductive nanoparticles is greater in polyetherimide and the electrical conductivity is therefore enhanced.

Further, the following test was performed to confirm the material properties with respect to polyetherimide as one example of the material of the porous membrane member.

One μL of water and tetradecane, respectively, as dispersion media was dropped on a polyetherimide film in which multiple pores were not formed, and a contact angle was measured. The measurement result showed that the contact angle for both water and tetradecane was in a range from 30 degrees to 40 degrees. Based on this result it was found that polyetherimide as one example of the material of the porous membrane member has a combination of both a hydrophilic property and an affinity for organic solvents.

Further, the contact angle when 1 μL of tetradecane was dropped on a polyimide film that is used as a material of the film substrate 3 and the like was 20 degrees or less. Based on this result, it was found that a polyimide film has an affinity for organic solvents.

In this connection, as described above, a thickness of a stepped portion 62 that is a portion of the porous membrane treated member 6 other than the lower side of the ink-jet wiring pattern 7 is thinned to a degree that is approximately ⅕ of the thickness of the porous membrane member 6'. However, although there are also cases in which, depending on the material of the porous membrane member and the solvent that dissolves the porous membrane member, the stepped portion 62 becomes thinner without limit or dissolves and disappears, from the viewpoint of adhesive power with respect to the film substrate 3 it is preferable to retain the stepped portion 62 of the porous membrane treated member 6.

Furthermore, although both polyamide-imide and polyetherimide are a white color, polyamide-imide and polyetherimide become transparent upon performance of a solution treatment. In particular, by the stepped portion 62 becoming transparent, for example, the present invention can be applied to a transparent conductive film.

Although polyamide-imide and polyetherimide have been mentioned as examples of the porous membrane member 6' according to the present embodiment as described above, other porous membrane members may also be used. As such kind of porous membrane member, it is preferable to use a porous membrane member that is penetrated more in the thickness direction than in the width direction by a substance.

Hereunder, the configuration of a modification example will be described using FIG. 7 to FIG. 11.

According to the present embodiment, the porous membrane treated member 6 is disposed on the surface of the film substrate 3. However, as shown by a wiring board 10 illustrated in FIG. 7, the porous membrane treated member 6 may be disposed directly on the surface of the substrate 2. In this connection, an example of "the porous membrane member layer is disposed on a surface of the substrate on which the second wiring pattern is not formed" according to the present invention corresponds to the porous membrane treated member layer 8 being disposed on a surface on an opposite side to a surface on which the transferred wiring pattern 4 is formed of the substrate 2.

Further, according to the wiring board 1 of the present embodiment, the porous membrane treated member 6 whose thickness is made thinner by dissolving a framework (or wall surfaces) that forms holes of the porous membrane member 6' using a solution is disposed on the surface of the film substrate 3. However, as illustrated by a wiring board 11 shown in FIG. 8, a configuration may also be adopted in which the porous membrane member 6' is disposed as it is on the surface of the film substrate 3 without performing treatment using a solution. However, a configuration in which the framework (or wall surfaces) forming the holes is dissolved is more preferable because the electrical resistance decreases. In this connection, the porous membrane member 6' also corresponds to an example of the porous membrane member of the present invention, and a porous membrane member layer 8' that includes the porous membrane member 6' also corresponds to an example of the porous membrane member layer of the present invention.

Figure 9:
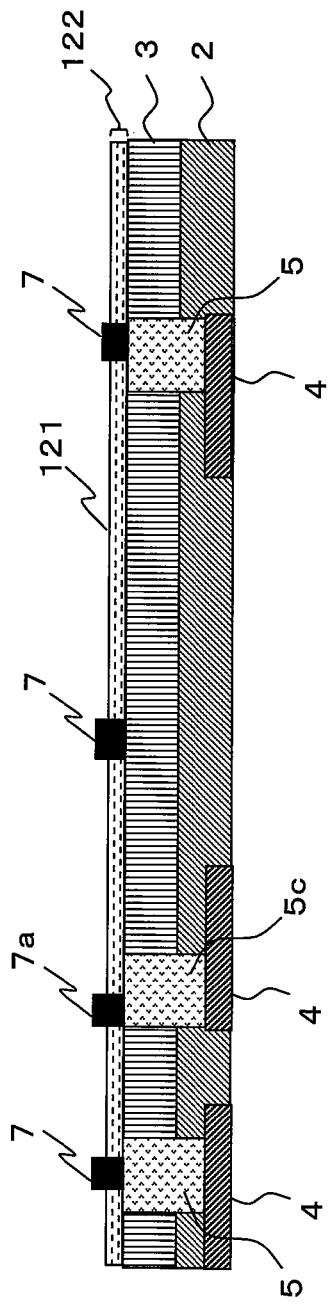
FIG. 9 is a sectional configuration diagram of a wiring board 12 as a modification example according to Embodiment 1 of the present invention.

Furthermore, although according to the wiring board 1 the porous membrane treated members 6 are disposed on some parts of the surface of the film substrate 3, a configuration may also be adopted, as shown by a wiring board 12 in FIG. 9, in which a porous membrane treated member layer 122 on which a porous membrane treated member 121 that has undergone a solution treatment has been affixed is formed over the entire surface of the film substrate 3. The porous membrane treated member layer 122 corresponds to an example of "a porous membrane member layer that includes a porous membrane member over an entire region of one layer" of the present invention.

According to the present embodiment, when forming the transferred wiring pattern 4, as shown in FIG. 3(A), the dry film resist 15 is directly attached onto the carrier sheet 9. However, a configuration may also be adopted in which a release metal layer is provided on the carrier sheet 9 to facilitate release of the transferred wiring pattern 4 from the carrier sheet 9 and thereby the transferred wiring pattern 4 is formed.

Although an additive process is used in FIGS. 3(A) to (D), a subtractive process or the like that adheres a copper foil to the carrier sheet 9 and removes a portion other than a wiring pattern therefrom may also be used. Further, the transferred wiring pattern 4 may be formed on the carrier sheet 9 using a screen printing method that squeezes out an electrically conductive paste from a printing plate using a squeegee. In this connection, it is sufficient to use a substance including metal particles such as copper, gold, or silver particles as the electrically conductive paste used to form the transferred wiring pattern 4, and it is not necessary to include metal particles with a mean particle size of 30 nm or less, as in the electrically conductive nanoparticle paste 17 that is discharged by the ink-jet method.

Figure 10:
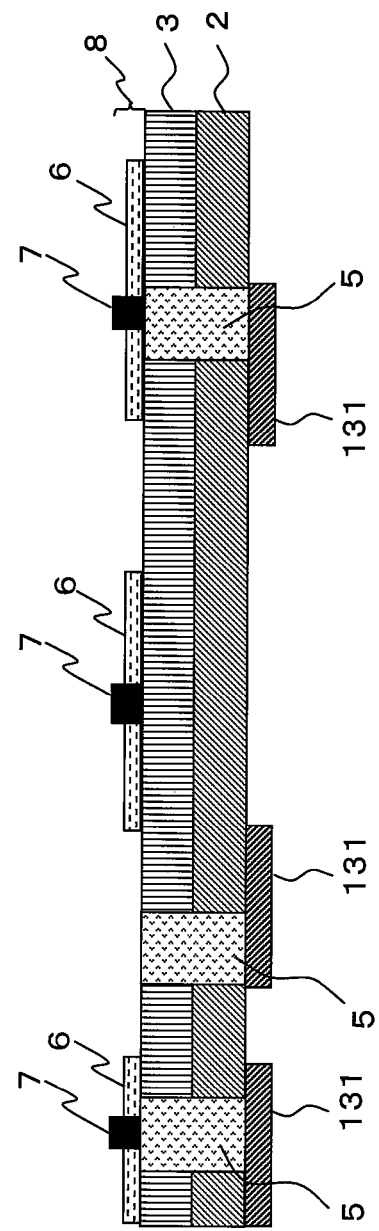
FIG. 10 is a sectional configuration diagram of a wiring board 13 as a modification example according to Embodiment 1 of the present invention.

Further, although according to the wiring board 1 of the present embodiment the transferred wiring pattern 4 is embedded in the substrate 2 by using a transfer method, a configuration may also be adopted in which the wiring pattern protrudes from the surface of the substrate 2, as illustrated by a wiring pattern 131 of a wiring board 13 shown in FIG. 10. When creating the wiring pattern 131 for the wiring board 13 in this manner, a method other than a transfer method can be used. For example, a desired wiring pattern can be formed on a surface of the substrate 2 by performing the additive process illustrated in FIGS. 3(A) to (D) on the substrate 2 in place of the carrier sheet 9. Further, similarly to the case described above, the wiring pattern 131 may be created using a subtractive process or may be created using a screen printing method or the like that squeezes out an electrically conductive paste from a printing plate using a squeegee. In short, any manufacturing method may be used as long as the wiring pattern 131 can be formed. In this connection, in the wiring board 13 shown in FIG. 10, an example of a second wiring pattern of the present invention corresponds to the wiring pattern 131. Further, it is sufficient to use a substance including metal particles such as copper, gold, or silver particles as the electrically conductive paste used to form the wiring pattern 131, and it is not necessary to include metal particles with a mean particle size of 30 nm or less, as in the electrically conductive nanoparticle paste 17 that is discharged by the ink-jet method.

Figure 11:
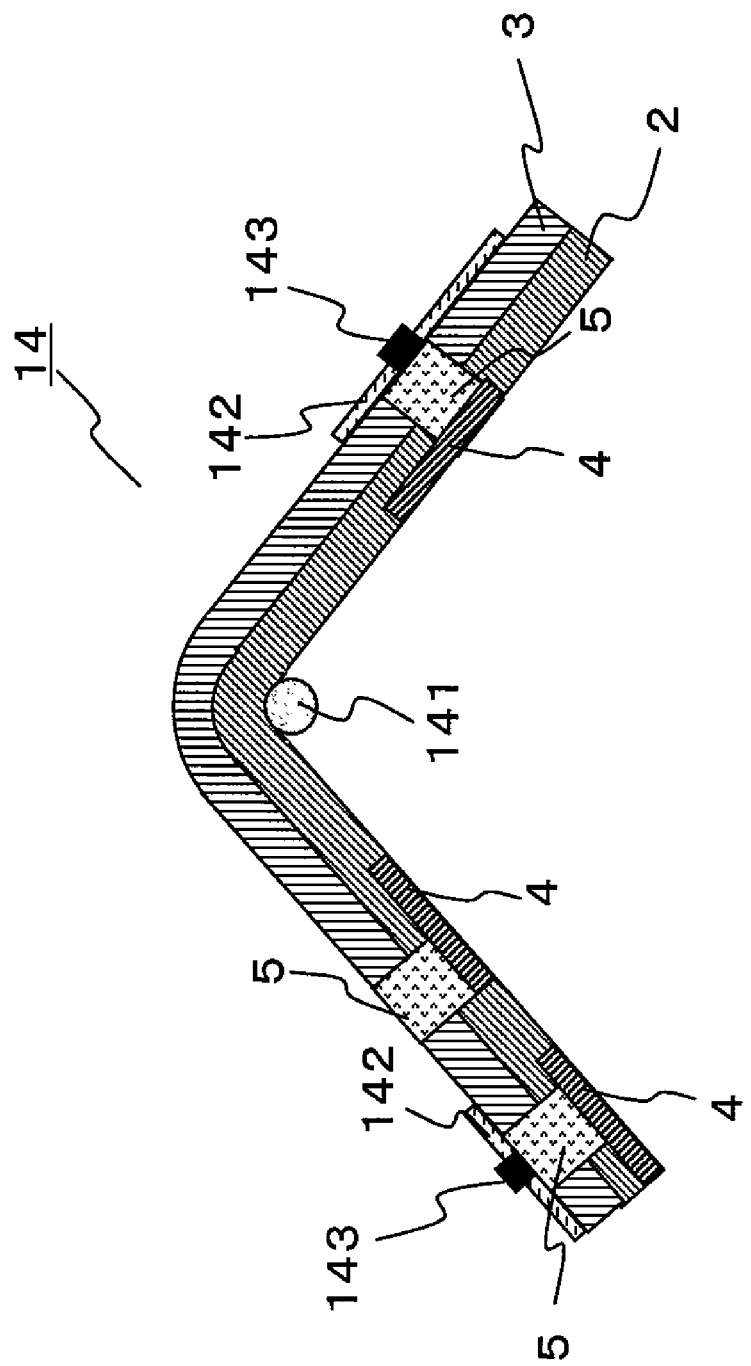
FIG. 11 is a sectional configuration diagram of a wiring board 14 as a modification example according to Embodiment 1 of the present invention.

Further, according to the present embodiment, because an organic film is used for the film substrate 3, the wiring board 1 is a flexible board and can be bent. FIG. 11 is a view that shows a bent wiring board 14. The wiring board 14 bends at a bending section 141, and the configuration of an ink-jet wiring pattern 143 is different to that of the ink-jet wiring pattern 7 of the wiring board 1. Because the wiring board 14 bends around the bending section 141, in the case of forming a wiring pattern by the ink-jet method in the vicinity of the bending section 141 of the substrates 2 and 31 it is possible that peeling or fracturing of wiring lines will occur due to a strain caused by bending. Therefore, in comparison to the ink-jet wiring pattern 7 of the wiring board 1, the wiring lines of the ink-jet wiring patterns 142 of the wiring board 14 are not formed in the vicinity of the center of the film substrate 3 (vicinity of the bending section 141). In this connection, although the transferred wiring pattern 4 is more robust with respect to strain and the like than the ink-jet wiring pattern 143 that is formed by the ink-jet method, from the viewpoint of preventing the breaking of wiring lines and the like it is more preferable not to dispose the transferred wiring pattern 4 in the vicinity of the bending section 141.

Embodiment 2

Next, a wiring board according to Embodiment 2 of the present invention will be described.

According to the present embodiment, a wiring board is described that has a configuration in which an ink-jet wiring pattern is formed on the surface of a substrate in which a transferred wiring pattern has been formed. Although the basic structure of the wiring board of the present embodiment 2 is the same as that of Embodiment 1, the present embodiment differs from Embodiment 1 in the respect that the porous membrane treated member 6 is arranged on the surface of a substrate in which a transferred wiring pattern has been formed. Consequently, the following description centers on the present point of difference. In this connection, in the present embodiment 2 the same symbols are used to denote constituent elements that are substantially the same as in Embodiment 1.

Figure 12:
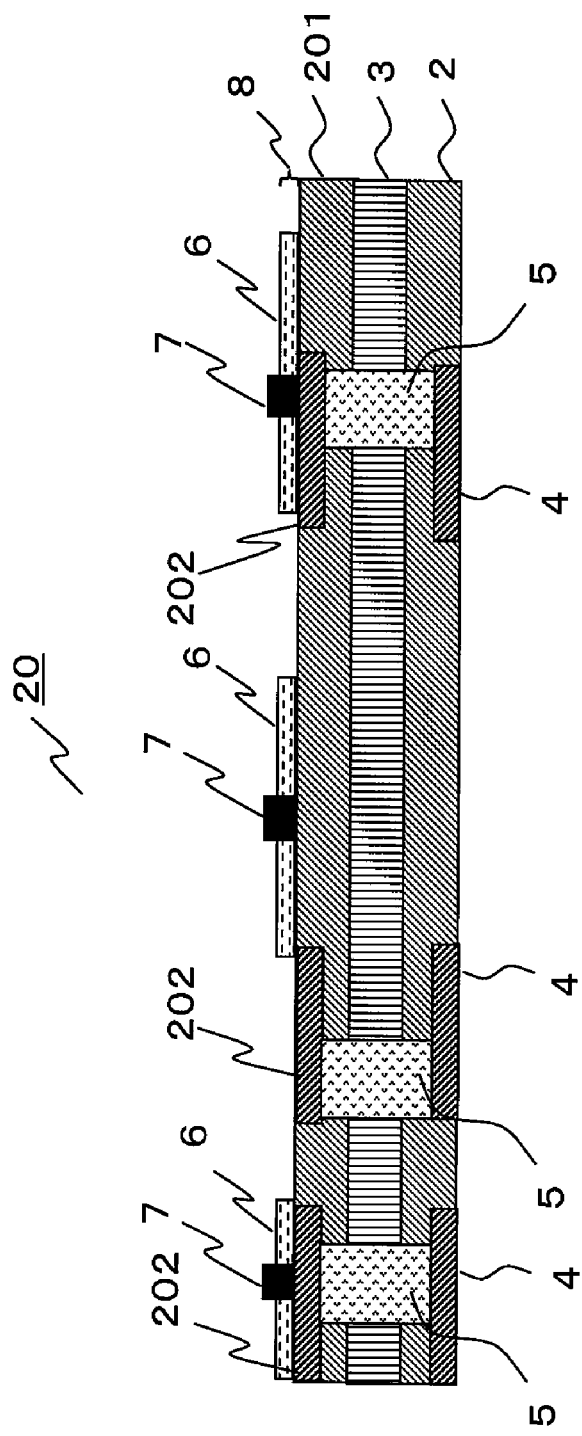
FIG. 12 is a sectional configuration diagram of a wiring board 20 according to Embodiment 2 of the present invention.

FIG. 12 is a sectional configuration diagram of a wiring board 20 according to the present embodiment 2. The wiring board 20 shown in FIG. 12 includes the film substrate 3 that comprises an organic film, the substrate 2 and a substrate 201 that are arranged so as to sandwich the film substrate 3, and the porous membrane treated members 6 that are provided on the surface of the substrate 201. The transferred wiring patterns 4 are formed in the substrate 2, similarly to Embodiment 1, and the ink-jet wiring pattern 7 is formed in the porous membrane treated member 6. Similarly to the substrate 2, the substrate 201 is a tabular substrate that is made from a material that includes a thermosetting resin, and a transferred wiring pattern 202 is formed in the substrate 201 by the above described transfer method. The transferred wiring pattern 202 is embedded such that the surface thereof is exposed so as to be on substantially the same plane as the surface of the substrate 201.

As described above, according to the present embodiment 2, the porous membrane treated member 6 is disposed on a surface in which the transferred wiring pattern 202 that has been created by a transfer method is formed, and the ink-jet wiring pattern 7 is created in the porous membrane treated member 6. According to the present embodiment 2, the following advantages can be exhibited in addition to the advantages described with respect to Embodiment 1.

By forming both a transferred wiring pattern and an ink-jet wiring pattern on the same surface side as described above, it is sufficient to use an ink-jet wiring pattern only for sections in which the width of or interval between wiring lines is minute, for example, 20 μm or less. Consequently, sections that use an ink-jet wiring pattern can be reduced.

Since nano-order metal particles are used in an ink-jet wiring pattern, peeling or cracking due to vertical movement of heat at the time of a reflow or the like is more liable to occur in comparison with a transferred wiring pattern. There is thus the advantage that the occurrence of peeling or cracks can be suppressed by reducing as much as possible sections that use an ink-jet wiring pattern.

Further, the high-frequency signal transfer characteristics of an ink-jet wiring pattern are inferior to those of a transferred wiring pattern. There is thus the advantage that high-frequency signal transfer characteristics can be enhanced by reducing as much as possible sections that use an ink-jet wiring pattern.

In this connection, an example of "the porous membrane member layer is disposed on a surface of the substrate in which the second wiring pattern is formed" of the present invention corresponds to the porous membrane treated member layer 8 being disposed in an adjoining manner on the surface of the substrate 201 in which the transferred wiring pattern 202 is formed according to the present embodiment. Further, an example of a second wiring pattern of the present invention corresponds to the transferred wiring pattern 202. Furthermore, an example of a region of the present invention corresponds to the entire size of the surface of the substrate 201 according to the present embodiment.

Hereunder, modification examples of the present embodiment are described.

Although two substrates including a thermosetting resin are provided according to the wiring board 20 of the present embodiment, as shown by a wiring board 21 illustrated in FIG. 13(A), a configuration may also be adopted in which the substrate 2 is not provided. Further, as shown by a wiring board 22 illustrated in FIG. 13(B), a configuration may be adopted in which the film substrate 3 of the wiring board 21 shown in FIG. 13(A) is not provided.

Figure 14:
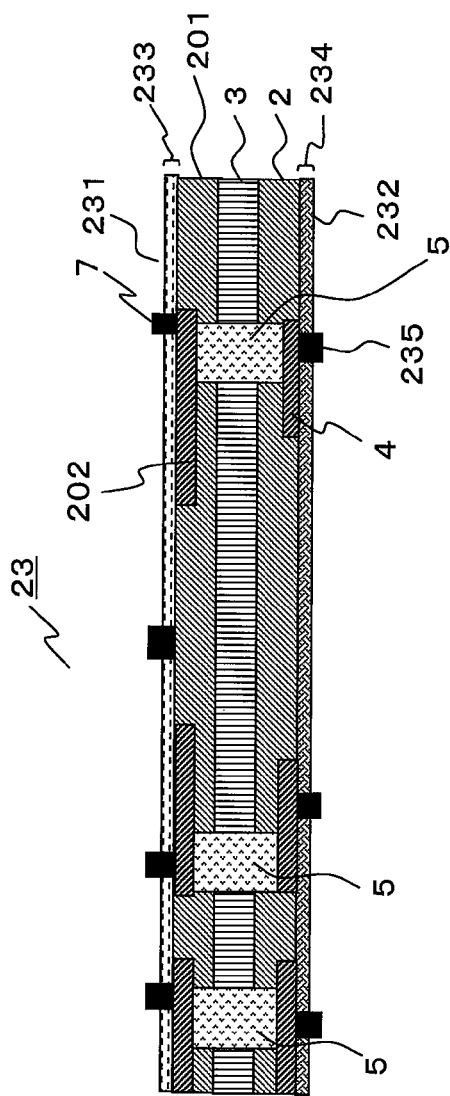
FIG. 14 is a sectional configuration diagram of a wiring board 23 as a modification example according to Embodiment 2 of the present invention.

Further, as in the case of a wiring board 23 having the configuration shown in FIG. 14, a configuration may also be adopted in which porous membrane treated members formed by subjecting porous membrane members to a solution treatment are provided over the entire areas on both sides, and ink-jet wiring patterns are formed by an ink-jet method on those two sides. In comparison to the wiring board 20, in the wiring board 23 a porous membrane treated member 231 formed by subjecting a porous membrane member to a solution treatment is provided over the entire surface of the substrate 201. A porous membrane treated member layer 233 is formed by the porous membrane treated member 231. Further, a porous membrane treated member 232 formed by subjecting a porous membrane member to a solution treatment is also provided over the entire surface of the substrate 2, and an ink-jet wiring pattern 235 that is formed by an ink-jet method is provided on the porous membrane treated member 232. A porous membrane treated member layer 234 is formed by the porous membrane treated member 232.

In this case, materials having different thermal expansion coefficients are included as principal constituents in the porous membrane treated member 231 and the porous membrane treated member 232, respectively. This is done to suppress warpage that occurs in the wiring board when the ambient temperature changes, due to a difference in the density of the transferred wiring pattern 4 with respect to the substrate 2 and the density of the transferred wiring pattern 202 with respect to the substrate 201.

More specifically, for example, when it is assumed that the area of the transferred wiring pattern 4 at the substrate surface is greater than that of the transferred wiring pattern 202, since the thermal expansion coefficient of the substrates 2 and 201 that comprise a thermosetting resin is greater than that of the transferred wiring patterns 4 and 202 that are formed with copper, in a case in which, for example, the ambient temperature increases at the time of a reflow or the like, the apparent thermal expansion of the side of the substrate 201 that includes the transferred wiring pattern 202 increases more than that of the side of the substrate 2 including the transferred wiring pattern 4. Consequently, warpage occurs in which the substrate 201 side becomes a convex side and the substrate 2 side becomes a concave side.

Therefore, it is possible to suppress the occurrence of warpage by selecting as the material of the porous membrane treated member 232 to be disposed on the substrate 2 side a material for which the thermal expansion coefficient is larger than that of the material of the porous membrane treated member 231 to be disposed on the substrate 201 side. In this connection, an example of "a different other single layer" of the present invention corresponds to the substrate 2, and an example of "a further different other single layer" of the present invention corresponds to the porous membrane treated member layer 234. Further, an example of "the two porous membrane member layers are disposed so as to sandwich the two substrates" corresponds to the porous membrane treated member layer 233 including the porous membrane treated member 231 and the porous membrane treated member layer 234 including the porous membrane treated member 232 being disposed so as to sandwich the two substrates 2 and 201, as shown in FIG. 14.

In a case in which warpage only occurs that is within an allowable range, the same material may be used for the porous membrane treated members 231 and 232. For example, in a case in which the material of the transferred wiring pattern 4 and the transferred wiring pattern 202 is the same and the area of each is substantially the same, since warpage only occurs to a certain extent the same material may be used as the porous membrane treated members 231 and 232.

Although in FIG. 14 members that are formed by subjecting porous membrane members to a solution treatment are arranged over the entire surface of the substrate 2 and substrate 201, a configuration may also be adopted in which the members are arranged in a local manner on the surfaces.

Figure 15:
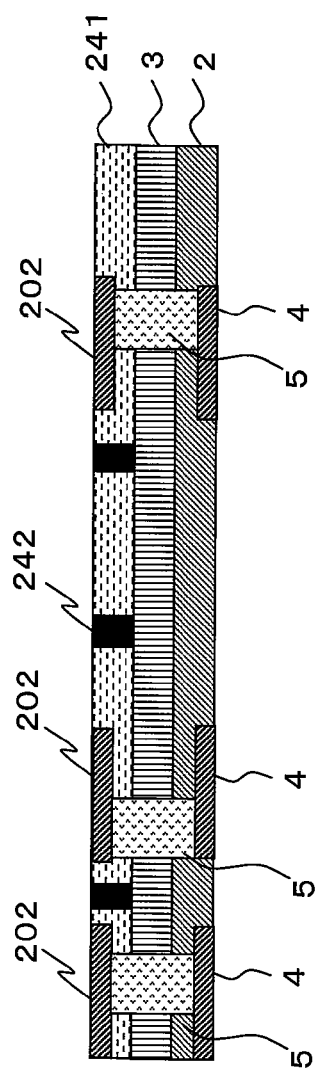
FIG. 15 is a sectional configuration diagram of a wiring board 24 as a modification example according to Embodiment 2 of the present invention.

Further, the wiring board may be a wiring board 24 as shown in FIG. 15. The wiring board 24 has a configuration which is provided with a porous membrane member layer 241 formed by porous membrane members that have not been subjected to a solution treatment, instead of the substrate 201 of the present embodiment. A transferred wiring pattern 202 is formed by a transfer method in the porous membrane member layer 241, and an ink-jet wiring pattern 242 is also formed in the porous membrane member layer 241 by an ink-jet method. In this connection, the porous membrane member layer 241 corresponds to one example of an identical layer that is formed by porous membrane members of the present invention.

In this connection, similarly to the wiring board shown in FIG. 8 that is a modification example of Embodiment 1, in the wiring board 20 of the present embodiment the porous membrane members may be disposed as they are without performing treatment using a solution. Further, the wiring board 20 of the present embodiment may also be bent similarly to the configuration illustrated in FIG. 11.

Figure 16:
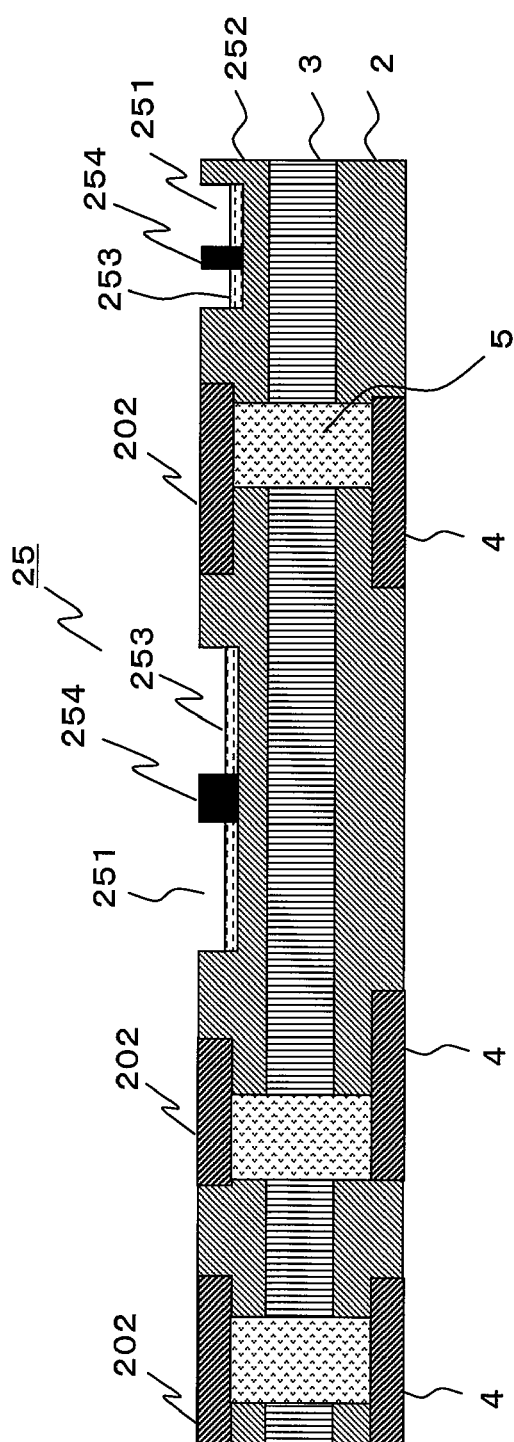
FIG. 16 is a sectional configuration diagram of a wiring board 25 as a modification example according to Embodiment 2 of the present invention.

Furthermore, although according to the wiring board 20 of the present embodiment the porous membrane treated member 6 is disposed on the surface of the substrate 201, a configuration may also be adopted in which a member comprising a porous membrane member that has undergone a solution treatment is provided in a concave section formed in a substrate. FIG. 16 is a view that shows a sectional configuration diagram of a wiring board 25 that is configured in this manner. In comparison to the wiring board 20, the wiring board 25 is provided with a substrate 252 in which a concave section 251 is formed instead of the substrate 201. A porous membrane treated member 253 comprising a porous membrane member that has undergone a solution treatment is provided in the concave section 251. An ink-jet wiring pattern 254 is formed by the above described ink-jet method in the porous membrane treated member 253. In this connection, a porous membrane member in a state before performance of a solution treatment may be provided in place of the porous membrane treated member 253. Further, an example of an identical layer formed by an electrically insulative substrate of the present invention corresponds to the substrate 252 shown in FIG. 16, and an example of a concave section provided in a surface of a substrate corresponds to the concave section 251.

Figure 17:
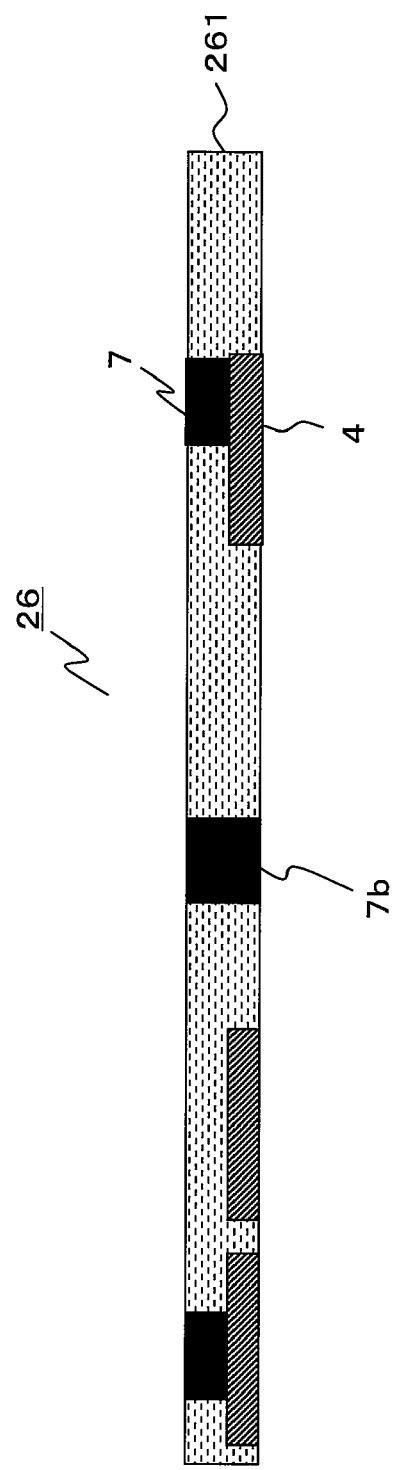
FIG. 17 is a sectional configuration diagram of a wiring board 26 as a modification example according to Embodiment 2 of the present invention.

As illustrated by a wiring board 26 shown in FIG. 17, a configuration may also be adopted in which the transferred wiring pattern 4 formed by a transfer method and the ink-jet wiring pattern 7 formed by an ink-jet method are provided in a porous membrane member layer 261 formed by a porous membrane member. In this connection, because the transferred wiring pattern 4 and the ink-jet wiring pattern 7 are contacting, the via 5 is not provided. According to the wiring board 26, since a wiring portion 7b of the ink-jet wiring pattern 7 is exposed on a surface side on which the transferred wiring pattern 4 is formed, the configuration is one in which an ink-jet wiring pattern is formed on the side of a surface on which a transferred wiring pattern is formed of a substrate in which a transferred wiring pattern is formed. In this connection, the porous membrane member layer 261 corresponds to one example of an identical layer that is formed by a porous membrane member of the present invention. Further, the wiring board 26 corresponds to an example of a single-layer wiring board of the present invention.

Embodiment 3

Hereunder, the configuration of a wiring board according to Embodiment 3 of the present invention is described.

According to the present embodiment a wiring board is described in which, unlike Embodiment 2, an ink-jet wiring pattern is formed on a surface of a substrate on which a wiring pattern has been formed by a method (excluding an ink-jet method) other than a transfer method.

FIG. 18(A) is a sectional configuration diagram of a wiring board 30 according to the present embodiment 3. The wiring board 30 of the present embodiment 3 includes a multilayer board 302 that is provided on a surface of the substrate 2, and a multilayer board 301 that is provided on a surface of the film substrate 3. FIG. 18(B) is a partially enlarged view of FIG. 18(A). In this connection, in the present embodiment 3 the same symbols are used to denote constituent elements that are the same as in Embodiment 2.

As shown in FIG. 18(B), the multilayer board 301 is formed of four substrates 303a to 303d, and vias 305a to 305d are formed in each of the substrates. The vias 305a to 305d connect the upper and lower layers of the substrates. Further, wiring patterns 304a to 304d are formed on the surface of the respective substrates. A wiring pattern 306 is formed on a surface of the film substrate 3.

The multilayer board 302 similarly includes four substrates that have a wiring pattern formed on the surface of each substrate, and vias that connect the upper and lower layers provided in each substrate. The substrate that is disposed at the lowermost side is denoted by reference numeral 302a (see FIG. 18(A)).

A porous membrane treated member 6 that is formed by subjecting a porous membrane member 6' to a solution treatment, and an ink-jet wiring pattern 7 that is formed in the porous membrane treated member 6 are provided on the surface of the multilayer board 301.

By using a substrate that comprises a material including a thermosetting resin as a component as the substrate of the multilayer boards 301 and 302 of the present embodiment 3, wiring patterns that are formed on the surface of each layer can be embedded into an adjoining substrate. More specifically, the wiring pattern 306 is embedded into the substrate 303a, the wiring pattern 304a is embedded into the substrate 303b, the wiring pattern 304b is embedded into the substrate 303c, and the wiring pattern 304c is embedded into the substrate 303d. The wiring pattern 304d that is provided in the substrate 303d protrudes from the surface of the substrate 303d. FIG. 18(C) is an enlarged view of the wiring pattern 304d. As shown in FIG. 18(C), the porous membrane treated member 6 is disposed so as to cover one part of the wiring pattern 304d that protrudes from the surface. The wiring pattern 304d is formed in the substrate 303d that is a single layer. The porous membrane treated member layer 8 including a plurality of porous membrane treated members 6 that are arranged at intervals is disposed on the surface of the substrate 303d on which the wiring pattern 304d is formed.

In this connection, a copper foil or the like can be used as the wiring patterns 304a to 304d and 306. Further, a method other than a transfer method can be used as the method of manufacturing the wiring patterns 304a to 304d and 306. For example, it is possible to use an additive process that deposits copper on a wiring pattern section, or a subtractive process that removes a portion other than a wiring pattern from an adhered copper foil, or a screen printing method that squeezes out an electrically conductive paste from a printing plate using a squeegee. In comparison to the electrically conductive nanoparticle paste, it is not necessary for the aforementioned electrically conductive paste to include metal particles having a mean particle size of 30 nm or less.

As described above, according to the present embodiment, a porous membrane treated member 6 is disposed on a surface on which a wiring pattern 304d is formed, and an ink-jet wiring pattern 7 is created.

By forming both an ink-jet wiring pattern and a wiring pattern that is formed using a method other than an ink-jet method and a transfer method on the same surface side in this manner, similarly to the above described Embodiment 2, it is possible to decrease as much as possible a portion that uses an ink-jet wiring pattern, and thus the occurrence of peeling or cracks can be suppressed and the transfer characteristics of a high frequency signal can be enhanced.

In this connection, an example of the substrate of the present invention corresponds to the substrate 303d of the present embodiment, and an example of the porous membrane member layer of the present invention corresponds to the porous membrane treated member layer 8 of the present embodiment. Further, an example of the first wiring pattern of the present invention corresponds to the ink-jet wiring pattern 7 of the present embodiment, and an example of the second wiring pattern of the present invention corresponds to the wiring pattern 304d of the present embodiment. Further, an example of "the porous membrane member layer is disposed on a surface of the substrate in which the second wiring pattern is formed" of the present invention corresponds to the porous membrane treated member layer 8 of the present embodiment being disposed on the surface of the substrate 303d on which the wiring pattern 304d is formed.

Figure 19:
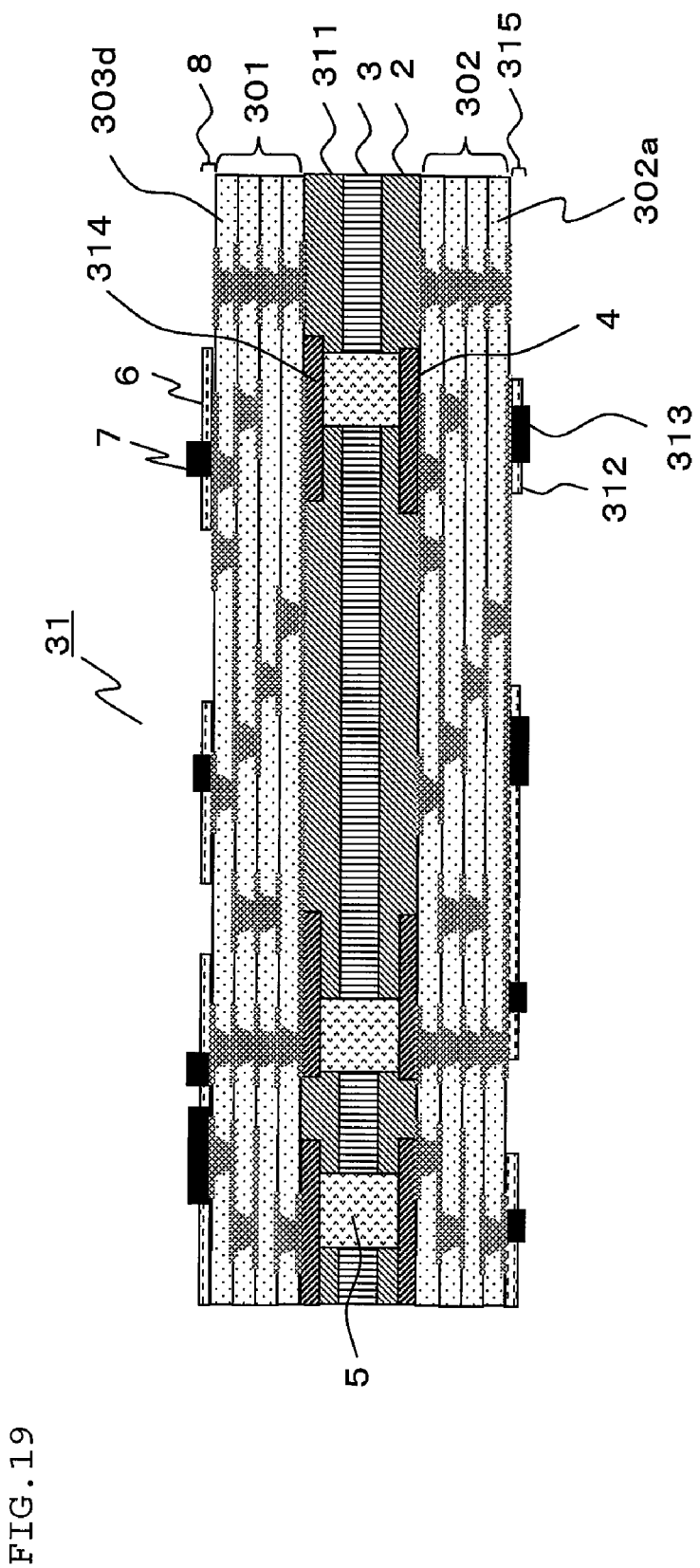
FIG. 19 is a sectional configuration diagram of a wiring board 31 as a modification example according to Embodiment 3 of the present invention.

Further, the configuration of a wiring board 31 as shown in FIG. 19 may also be adopted. Unlike the above described wiring board 30, the wiring board 31 is provided with a substrate 311 in which a transferred wiring pattern 314 is formed by a transfer method between the film substrate 3 and the multilayer board 301. Further, a porous membrane treated member layer 315 that is formed with porous membrane treated members 312 formed by subjecting porous membrane members to a solution treatment is also provided on the surface of the multilayer board 302. An ink-jet wiring pattern 313 that is created by an ink-jet method is formed in the porous membrane treated member 312. Thus, a configuration may be adopted in which wiring patterns are formed by an ink-jet method on both surfaces of a board that comprises a plurality of layers.

In this connection, an example of "a different other single layer" of the present invention corresponds to the substrate 302a, and an example of "a further different other single layer" of the present invention corresponds to the porous membrane treated member layer 315. Further, an example of "the two porous membrane member layers are disposed so as to sandwich the two substrates" corresponds to the porous membrane treated member layer 8 including the porous membrane treated member 6 and the porous membrane treated member layer 315 including the porous membrane treated member 312 as shown in FIG. 19 being disposed so as to sandwich the two substrates 303d and 302a.

Further, an example of a plurality of layers of the present invention that are sandwiched by two substrates corresponds to the multilayer board 301 excluding the substrate 303d, the substrate 311, the film substrate 3, the substrate 2, and the multilayer board 302 excluding the substrate 302a.

Figure 20:
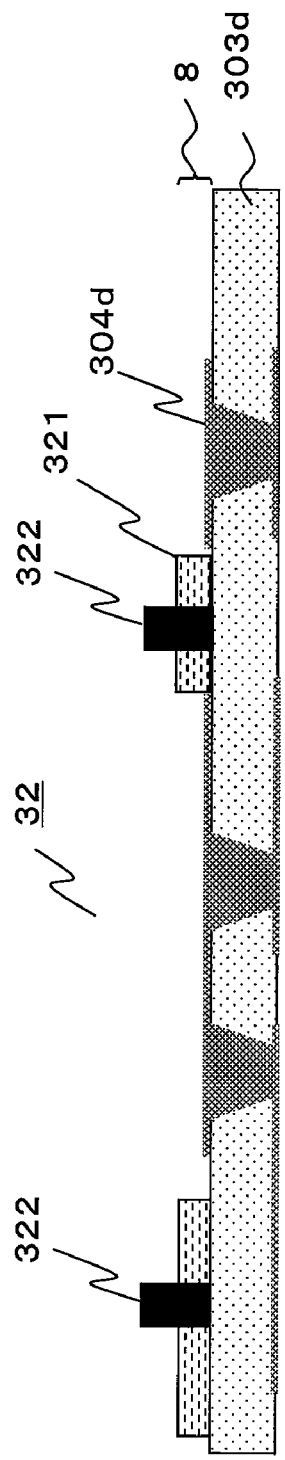
FIG. 20 is a sectional configuration diagram of a wiring board 32 as a modification example according to Embodiment 3 of the present invention.

Although according to the present embodiment a porous membrane treated member formed by subjecting a porous membrane member to a solution treatment is provided so as to cover one part of a wiring pattern that protrudes from the surface of a substrate, as shown in the partially enlarged view of a wiring board 32 in FIG. 20, a configuration may also be adopted in which a porous membrane treated member 321 is disposed between the wiring patterns 304d so as not to cover the wiring patterns 304d, and an ink-jet wiring pattern 322 is formed in the porous membrane treated member 321.

Figure 18:
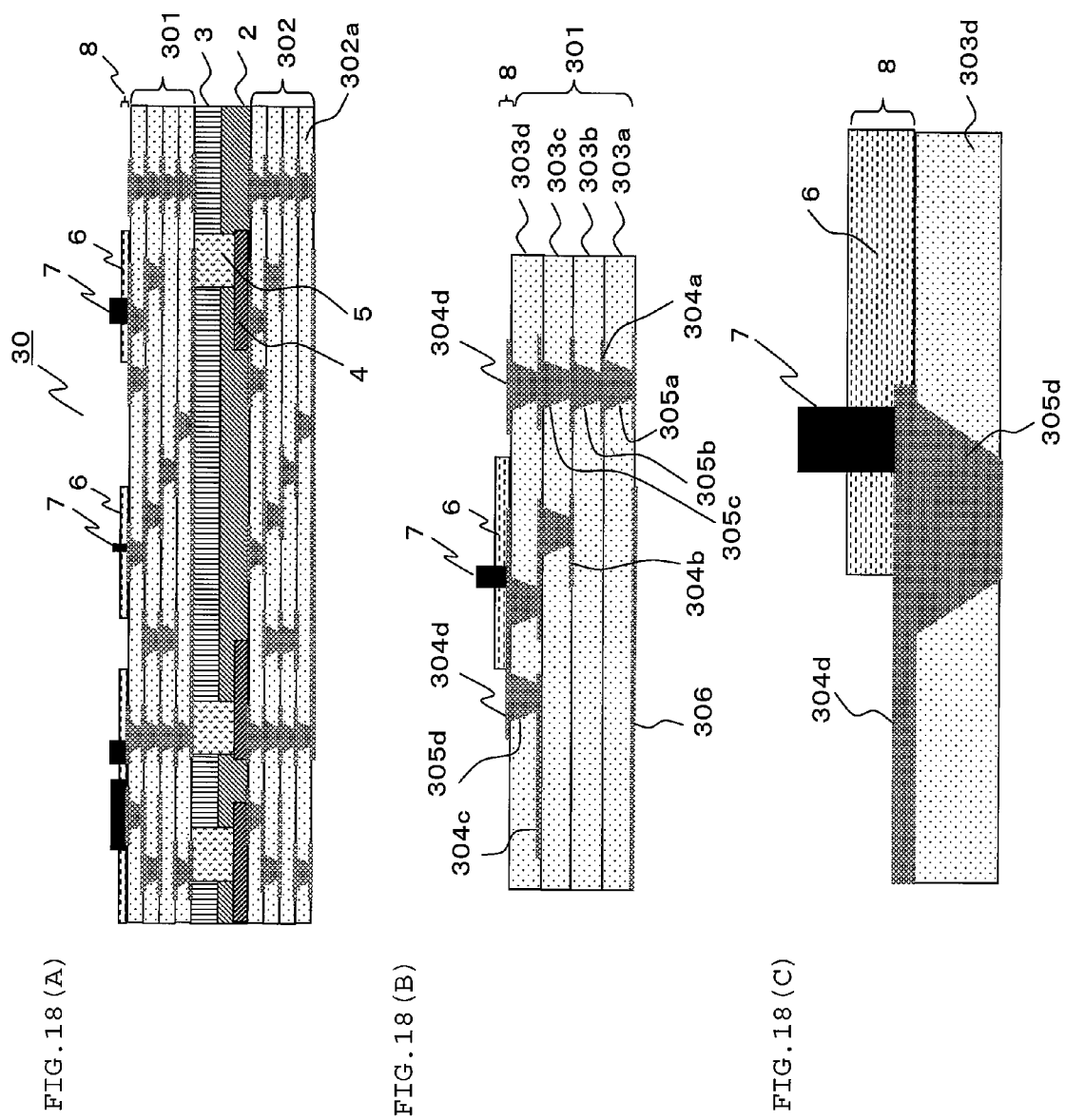
FIG. 18(A) is a sectional configuration diagram of a wiring board 30 according to Embodiment 3 of the present invention.
FIG. 18(B) is a partially enlarged configuration diagram of the wiring board 30 according to Embodiment 3 of the present invention.
FIG. 18(C) is a partially enlarged configuration diagram of the wiring board 30 according to Embodiment 3 of the present invention.

Although multilayer boards 301 and 302 are provided according to the wiring boards 30 and 31 shown in FIG. 18 and FIG. 19, the present invention is not limited to this kind of configuration, and a configuration may be adopted in which an ink-jet wiring pattern formed in a porous membrane treated member is provided on a board on which a wiring pattern has been formed on one side or both sides of at least one substrate.

Further, although a transferred wiring pattern is provided according to FIG. 18 and FIG. 19, a configuration may also be adopted in which a transferred wiring pattern is not provided.

Figure 21A:
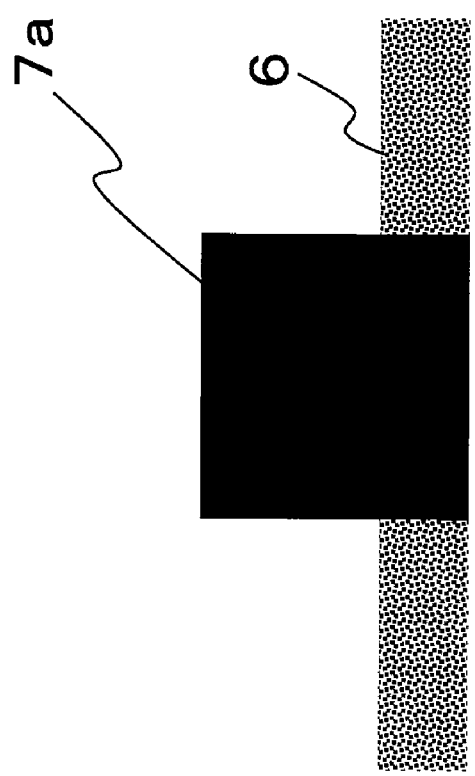
FIG. 21(A) is a sectional configuration diagram of a wiring portion that is formed using an ink-jet method according to Embodiments 1, 2, and 3 of the present invention.
Figure 21B:
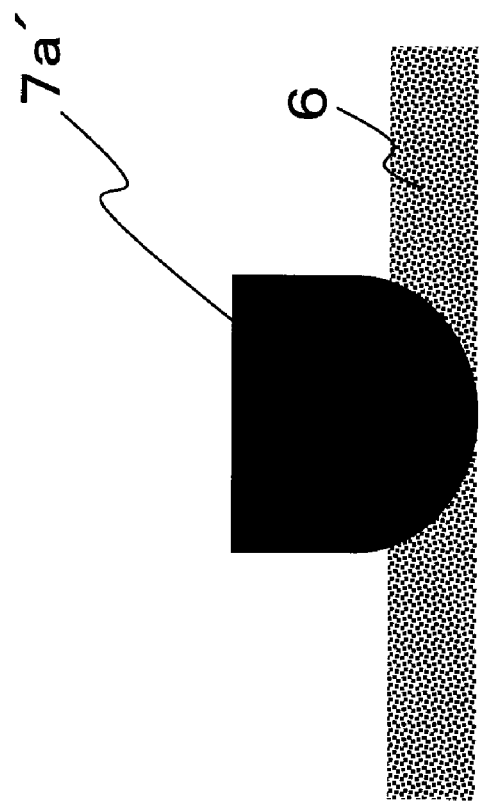
FIG. 21(B) is a sectional configuration diagram that shows a modification example of a wiring portion that is formed using an ink-jet method according to Embodiments 1, 2, and 3 of the present invention.

In the wiring boards described in the foregoing Embodiments 1 to 3, the wiring portion 7a of an ink-jet wiring pattern 7 formed by an ink-jet method is evenly formed in the thickness direction of the porous membrane treated member 6 as shown in FIG. 21(A). However, as illustrated by a wiring portion 7a' shown in FIG. 21(B), the wiring portion may be formed in a shape that has a curved lower part.

In this connection, although in FIGS. 21(A) and (B) the sections showing the ink-jet wiring patterns 7a and 7a' are illustrated completely as black and appear to be a single layer, as shown in FIGS. 5 and 6, in some cases the ink-jet wiring pattern is divided into two layers by the solution treatment.

In addition, when it is not necessary to electrically connect a wiring pattern with wiring that is arranged below the wiring pattern, wiring lines need not be formed as far as the bottom of a member formed by subjecting a porous membrane member to a solution treatment.

Embodiment 4

Next, a wiring board according to Embodiment 4 of the present invention will be described.

In Embodiment 4 a configuration is described in which, unlike Embodiments 1 to 3, layers in which a wiring pattern has been formed, respectively, by an ink-jet method are provided as a plurality of consecutive layers, and at least one portion of the ink-jet wiring pattern is used as a via.

FIG. 22(A) is a sectional configuration diagram of a wiring board 40 according to the present embodiment. In this connection, a board 405 comprises the substrates 2, 3, and 201, the transferred wiring patterns 4 and 202, and the via 5 that are described in Embodiment 2.

The wiring board 40 of the present embodiment includes a multilayer porous membrane substrate 401 that has layers formed with a plurality of porous membrane members on a surface of the substrate 201 described in Embodiment 2. The multilayer porous membrane substrate 401 comprises eight layers consisting of porous membrane member layers 402a to 402h. The porous membrane member layers 402a to 402h comprise ink-jet wiring patterns 403a to 403h that are each formed using an ink-jet method. At least one part of a wiring pattern of each layer functions as an interlayer connection via that electrically connects an upper and lower wiring pattern. For example, a via 404 that electrically connects from the porous membrane member layer 402a to the porous membrane member layer 402h is formed by the ink-jet wiring patterns 403a to 403h. In this connection, none of the porous membrane members that comprise the porous membrane member layers 402a to 402h are subjected to a solution treatment.

FIG. 22(B) is a partially enlarged view of the vicinity of the via 404. The via 404 is formed with linear symmetry around a center line 404s. More specifically, wiring portions 404a to 404h forming the via 404 in the ink-jet wiring patterns 403a to 403h of the respective porous membrane member layers 402a to 402h are arranged so that a center line in the width direction of the respective wiring portion matches the center line 404s.

In this connection, although, for example, as shown in FIG. 22(C), the shape in the width direction of wiring patterns 1000a and 1000b formed in upper and lower porous membrane member layers 1001a and 1001b need not be linearly symmetrical taking a line 1000s as a reference, in this case since the coefficients of thermal expansion in the horizontal direction in the figure with respect to the line 1000s are different, there is a possibility that cracking or peeling or the like of wiring lines will occur due to the occurrence of stress caused by an increase/decrease in the ambient temperature.

However, if the wiring portions are formed with linear symmetry around a center line 404s as shown in FIG. 22(B), the coefficients of thermal expansion in the horizontal direction with respect to the center line 404s are the same, and hence a stress applied to the wiring board is alleviated.

Further, according to FIG. 22(B), the via 404 is formed such that the width of the wiring portions 404d and 404e is wider than the width of the wiring portions 404a to 404c, the width of the wiring portion 404f is the same as that of the wiring portions 404a to 404c, and the width again widens at the wiring portions 404g and 404h.

If a case is supposed in which the width does not narrow at the wiring portion 404f, a stress produced by fluctuations in the ambient temperature of the wiring portions 404d to 404h will be applied to a connecting portion (denoted by reference numeral 405 in the figure) between the wiring portion 404a and the transferred wiring pattern 202 situation next to the wiring portion 404a.

However, according to the present embodiment, because the width of the wiring portion 404f is narrow, a stress is also easily applied between (denoted by reference numeral 406 in the figure) the wiring portion 404f and the wiring portion 404e. Consequently, the stress is dispersed at the two places denoted by reference numerals 405 and 406, and it is thereby possible to suppress the occurrence of cracking or peeling or the like of wiring lines caused by stress.

In this connection, an example of a substrate of the present invention corresponds to the substrate 201 of the present embodiment, and an example of "a predetermined number of porous membrane member layers that are adjacently disposed" of the present invention corresponds to the porous membrane member layers 402a to 402h of the present embodiment. Further, an example of at least one part of wiring portions of first wiring patterns of the present invention corresponds to the wiring portions 404a to 404h of the present embodiment.

Further, an example of a first predetermined porous membrane member layer of the present invention corresponds to the porous membrane member layer 402a of the present embodiment, and an example of a second predetermined porous membrane member layer of the present invention corresponds to the porous membrane member layer 402e of the present embodiment. Furthermore, an example of a third predetermined porous membrane member layer of the present invention corresponds to the porous membrane member layer 402f of the present embodiment, and an example of a fourth predetermined porous membrane member layer of the present invention corresponds to the porous membrane member layer 402h of the present embodiment.

An example of a second wiring pattern and a substrate of the present invention corresponds to the transferred wiring pattern 4 and the substrate 2, or the transferred wiring pattern 202 and the substrate 201.

The wiring board 40 of the present embodiment is formed by the same method as described in Embodiment 1 with respect to the substrate 201, substrate 2, and film substrate 3 portions. With respect to the multilayer porous membrane substrate 401, first, a sheet-like porous membrane member is affixed to the surface of the substrate 201, and thereafter the ink-jet wiring pattern 403a is formed on the porous membrane member using an ink-jet method to thereby form the porous membrane member layer 402a.

Subsequently, a porous membrane member is affixed on the porous membrane member layer 402a, and the ink-jet wiring pattern 403b is formed in the porous membrane member using an ink-jet method to create the porous membrane member layer 402b. The ink-jet wiring patterns 403c to 403h are formed in a similar manner in the other porous membrane member layers 402c to 402h to thereby create the wiring board 40.

As described above, according to the present embodiment, in addition to the advantages of the above described Embodiments 1 to 3, minute multilayer wiring can be simply formed using an ink-jet method by arranging porous membrane members without performing a solution treatment. Further, an ink-jet wiring pattern formed by an ink-jet method can also be used as an interlayer connection via.

In this connection, it is possible to control a penetration behavior by changing parameters such as the thickness or hole formation direction of a porous membrane member and a dropped amount of electrically conductive nanoparticle paste. According to the present embodiment, for example, each parameter is set so that the electrically conductive paste forming the ink-jet wiring pattern 403b stays in the porous membrane member layer 402b without penetrating to the porous membrane member layer 402a thereunder.

Although according to the present embodiment the widths of the wiring portion 404a and the wiring portion 404f are substantially the same, a configuration may also be adopted in which the width of the wiring portion 404f is smaller.

Further, although according to the present embodiment the substrate 201 is arranged between the film substrate 3 and the porous membrane member layer 402a, a configuration may also be adopted in which the substrate 201 is not arranged as shown in FIG. 1.

In this connection, when stress is not occurring to a significant degree, a structure may be adopted in which vias are not linearly symmetrical as shown in FIG. 22(C), and it is also not necessary to provide the structure that alleviates stress as denoted by reference numeral 406 in FIG. 22(B). In contrast, in a case in which a significant amount of stress occurs, sections at which the wiring width is narrowed (denoted by reference numerals 405 and 406 in FIG. 22(B)) may be increased to disperse the stress.

Although eight porous membrane member layers 402a to 402h are provided according to the wiring board 40 of the present embodiment, the number of layers may be suitably changed.

Figure 23:
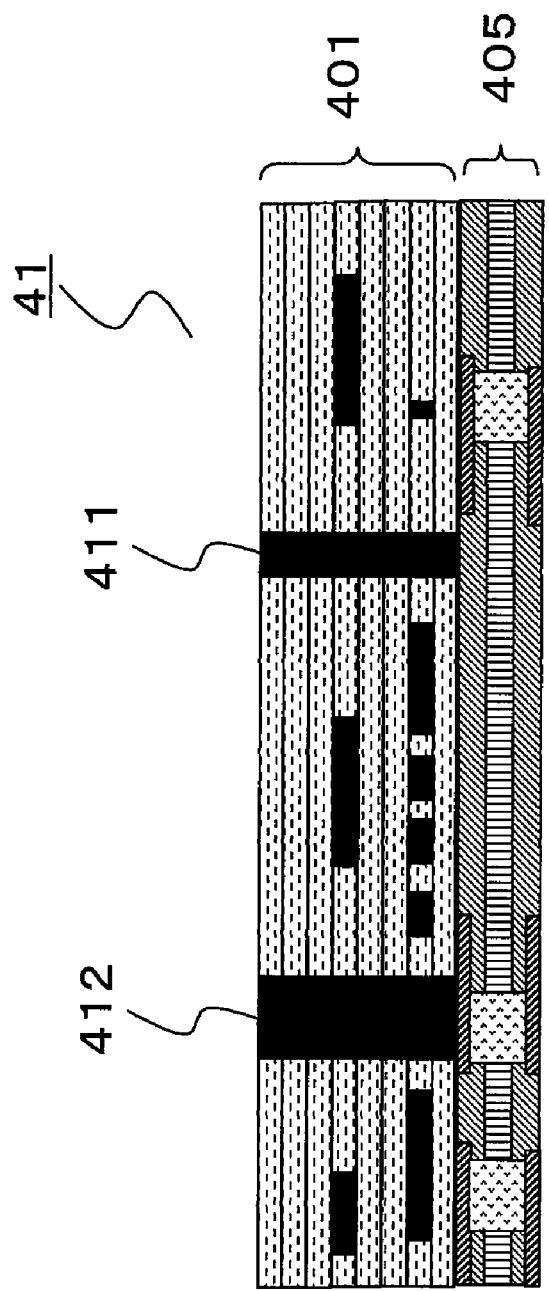
FIG. 23 is a sectional configuration diagram of a wiring board as a modification example according to Embodiment 4 of the present invention.

Further, although the width of wiring ports 404a to 404h of respective porous membrane member layers constituting the via 404 differs partially according to the wiring board 40 of the present embodiment, a configuration may also be adopted in which, as illustrated by a wiring board 41 shown in FIG. 23, vias 411 and 412 are provided that have substantially the same width in each of the porous membrane member layers.

Figure 24:
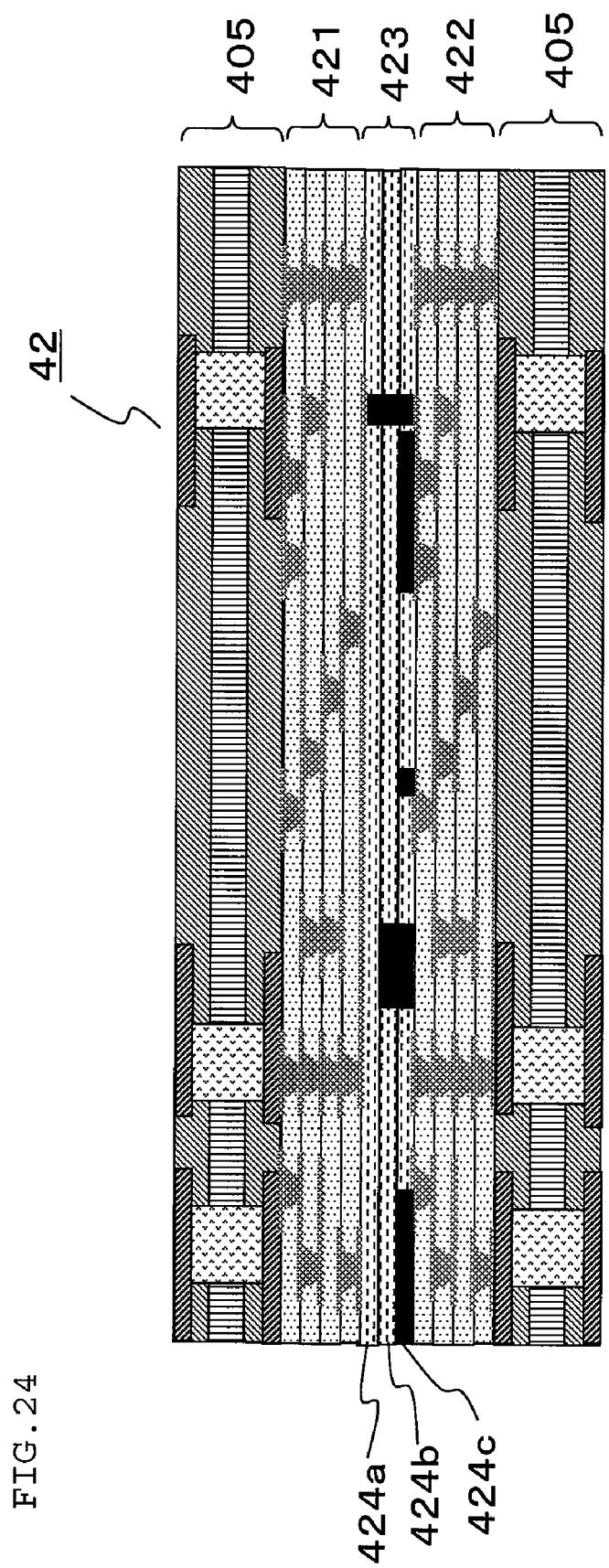
FIG. 24 is a sectional configuration diagram of a wiring board as a modification example according to Embodiment 4 of the present invention.

Furthermore, although a porous membrane member layer is only provided in the board 405 according to the wiring board 40 of the present embodiment, the wiring board may be a wiring board 42 that is provided with multilayer boards 421 and 422 that are the same as multilayer boards 301 and 302 comprising a plurality of boards as described in FIG. 19 and FIG. 20. FIG. 24 is a sectional configuration diagram of the wiring board 42. The wiring board 42 includes a multilayer porous membrane substrate 423 composed by three porous membrane member layers 424a, 424b, and 424c that are provided in the center, the multilayer boards 421 and 422 that are arranged so as to sandwich the multilayer porous membrane substrate 423, and two of the boards 405 that are arranged so as to sandwich the multilayer boards 421 and 422. In this connection, an example of a substrate of the present invention corresponds to any of the substrates comprising the multilayer boards 421 and 422 and the board 405.

At least one part of a wiring pattern formed in the multilayer porous membrane substrate 423 according to this structure is used as an interlayer connection via for electrically connecting the multilayer board 421 and the multilayer board 422. In this connection, although three porous membrane member layers are adjacently disposed according to the multilayer porous membrane substrate 423 in FIG. 24, a configuration may also be adopted in which only one porous membrane member layer is disposed.

Embodiment 5

Next, a wiring board according to Embodiment 5 of the present invention is described.

The wiring board of the present embodiment 5 differs from Embodiment 4 in the respect that a layer formed by an ultraviolet-curing resin is also provided in addition to the porous membrane member layer. Consequently, the following description centers on the present point of difference. In this connection, in the present embodiment 5 the same symbols are used to denote constituent elements that are the same as in Embodiment 4.

Figure 25:
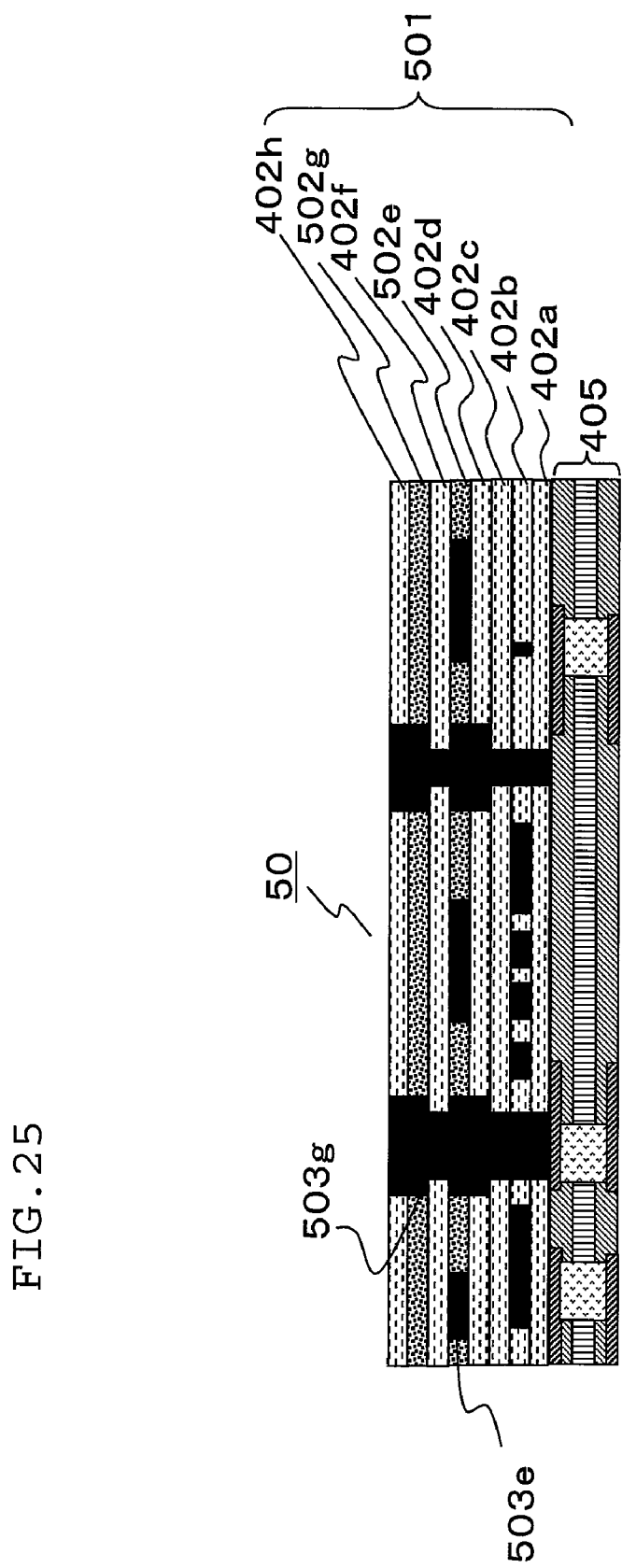
FIG. 25 is a sectional configuration diagram of a wiring board 50 according to Embodiment 5 of the present invention.

FIG. 25 is a sectional configuration diagram of a wiring board 50 according to the present embodiment 5. The wiring board 50 of the present embodiment 5 includes a multilayer board 501 that is provided on the upper surface of the board 405. Unlike the multilayer porous membrane substrate 401 of Embodiment 4, the multilayer board 501 is provided with ultraviolet-curing resin layers 502e and 502g instead of the porous membrane member layers 402e and 402g. Further, ink-jet wiring patterns 503e and 503g are formed in the ultraviolet-curing resin layers 502e and 502g, respectively.

Next, a method of creating the ultraviolet-curing resin layers is described.

First, an ultraviolet-curing resin is discharged by an ink-jet method onto the top surface of the porous membrane member layer 402d excluding the ink-jet wiring pattern 503e section, and ultra-violet rays are irradiated thereon to cure the ultraviolet-curing resin. After curing, electrically conductive nanoparticle paste is discharged using an ink-jet method onto the section on which the ultraviolet-curing resin has not been discharged, and the ink-jet wiring pattern 503e is formed by heating and baking to create the ultraviolet-curing resin layer 502e.

Subsequently, the porous membrane member layer 402f is formed, and the ultraviolet-curing resin layer 502g is formed on the top surface thereof by a similar method. In this connection, although an ink-jet method is used for the ink-jet wiring patterns 503e and 503g of the ultraviolet-curing resin layers 502e and 502g, because the ultraviolet-curing resin and electrically conductive nanoparticle paste that are discharged from the nozzle spread, a wiring pattern that is as minute as a case using a porous membrane member can not be formed.

Thus, a layer in which a wiring pattern that is as minute as in a porous membrane member layer is not formed can be created using an ultraviolet-curing resin layer, and thereby the material cost of the porous membrane member can be decreased. Further, since an ultraviolet-curing resin layer can be created using an ink-jet method, manufacturing can be performed without adding extra steps since it is sufficient to merely place the liquid for discharging the ultraviolet-curing resin in a discharge apparatus in addition to or instead of the liquid for discharging the electrically conductive nanoparticle paste.

Although according to the wiring board 50 shown in FIG. 25, ultraviolet-curing resin layers are sandwiched by porous membrane member layers, a configuration may be adopted in which ultraviolet-curing resin layers are formed in succession, and the number and location of ultraviolet-curing resin layers may also be suitably changed. Further, although a plurality of porous membrane member layers are provided according to the wiring board 50, a configuration may also be adopted in which only one layer is provided.

Further, according to the present embodiment also, similarly to Embodiment 4, parameters such as the thickness and hole formation direction of a porous membrane member, and a dropped quantity of the electrically conductive nanoparticle paste are set so that the electrically conductive paste that formed an ink-jet wiring pattern does not penetrate to a porous membrane member layer below.

Embodiment 6

Hereunder, a wiring board according to Embodiment 6 of the present invention is described.

Although the basic configuration of the wiring board according to the present embodiment 6 is the same as that of the wiring board of Embodiment 4, the wiring board according to the present embodiment differs from the wiring board of Embodiment 4 in the respect that cavities are formed in a porous membrane member layer comprising the multilayer porous membrane substrate 401. The following description centers on this point of difference. In this connection, in the present embodiment 6 the same symbols are used to denote constituent elements that are the same as in Embodiment 4.

Figure 26:
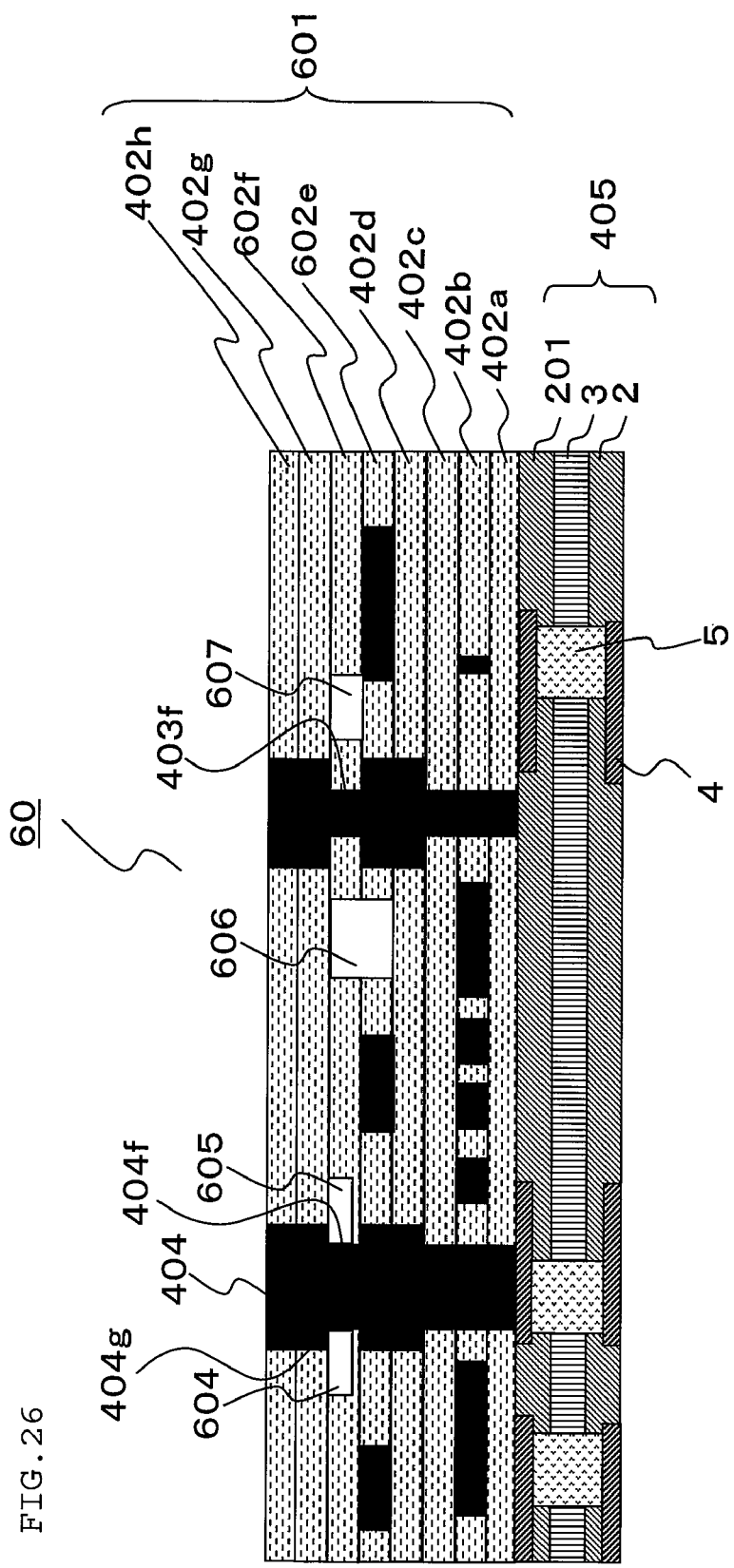
FIG. 26 is a sectional configuration diagram of a wiring board 60 according to Embodiment 6 of the present invention.

FIG. 26 is a sectional configuration diagram of a wiring board 60 according to the present embodiment 6. The wiring board 60 is provided with a multilayer porous membrane substrate 601 that is composed by a plurality of sheet-like porous membrane members on the upper surface of the board 405. The multilayer porous membrane substrate 601 differs from the multilayer porous membrane substrate 401 of Embodiment 4 in the respect that cavities 604, 605, 606, and 607 are provided therein.

The cavities 604 and 605 are formed adjacent to the wiring portion 404f at which the width of the via 404 narrows. Further, the cavity 606 is formed across porous membrane member layers 602e to 602f, and the cavity 607 is formed in the porous membrane member layer 602f. In this connection, the porous membrane member layers 602e and 602f have the same configuration as the porous membrane member layers 402e and 402f of Embodiment 4, except for the fact that cavities are provided therein. In this connection, an example of "the cavities are formed adjacent to one part of the first wiring pattern" of the present invention corresponds to the cavities 604 and 605 of the present embodiment being formed adjacent to the wiring portion 404f.

A method of creating the cavities 604 to 607 will now be described using FIG. 27(A) to FIG. 27(D).

Figure 27A:
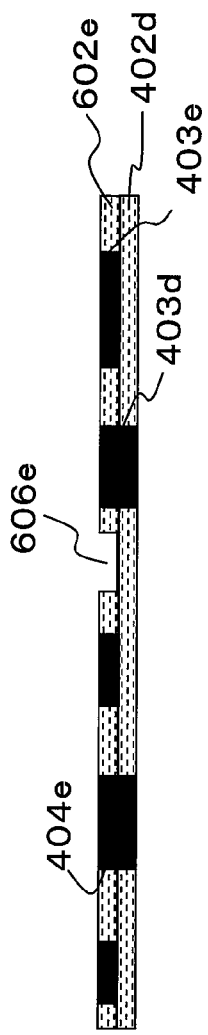
FIGS. 27(A) to (D) are views for describing a method of manufacturing the wiring board 60 according to Embodiment 6 of the present invention.

As shown in FIG. 27(A), a sheet-like porous membrane member from which a portion 606e corresponding to a cavity 606 has been removed is affixed to a top surface of the porous membrane member layer 402d, and the ink-jet wiring pattern 403e is formed to thereby create the porous membrane member layer 602e.

Figure 27B:
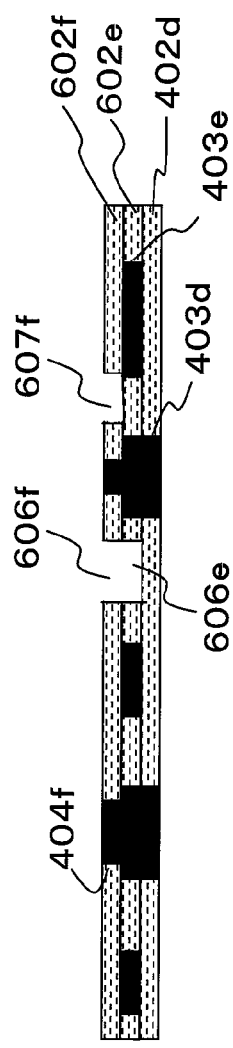

Next, as shown in FIG. 27(B), a sheet-like porous membrane member from which portions 606f and 607f corresponding to cavities 606 and 607 have been removed are affixed to the top surface of the porous membrane member layer 602e, and an ink-jet wiring pattern 403f is formed to thereby create the porous membrane member layer 602f.

Figure 27C:
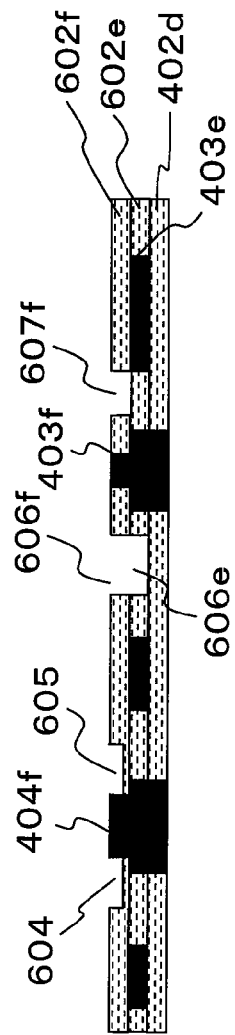

Next, as shown in FIG. 27(C), a solution treatment is performed in only an area in the vicinity of the wiring portion 404f that comprises the via 404 of the ink-jet wiring pattern 403f. By this solution treatment, a framework (or wall surfaces) that forms holes of the porous membrane member dissolves and the thickness of the porous membrane member becomes thinner so that the cavities 604 and 605 are formed.

Figure 27D:
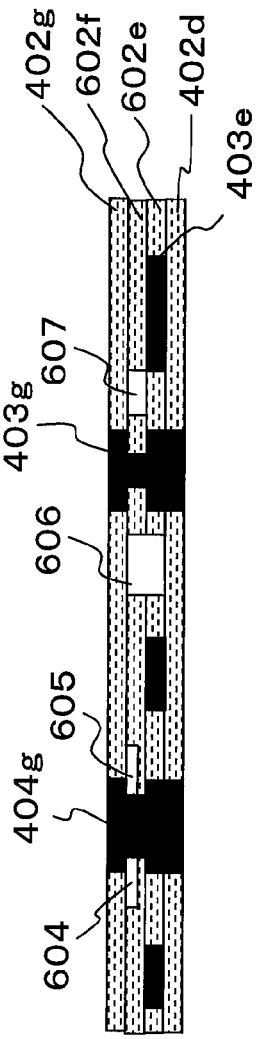

Subsequently, as shown in FIG. 27(D), a sheet-like porous membrane member is affixed to the top surface of the porous membrane member layer 602f, and the ink-jet wiring pattern 403g is formed to thereby create the porous membrane member layer 402g.

As described above, since cavities are formed on the underside of the wiring portion 404g at which the width of the via 404 is wide, even if the wiring of the porous membrane member layer 402g undergoes thermal expansion/contraction due to an increase/decrease in the ambient temperature caused by a reflow or the like, because there is no member on the underside thereof only the wiring expands/contracts, and the stress applied to the entire board is alleviated. In this connection, an example of "the cavities adjoin the one part of a first wiring pattern of at least one of the adjoining porous membrane member layers" of the present invention corresponds to the cavities 604 and 605 in FIG. 27 adjoining the wiring portion 404g of the porous membrane member layer 402g.

By the cavities 604 and 605 being provided adjoining the wiring portion 404f and 404g, an advantage is also exhibited whereby the transfer characteristics of a high frequency signal of the wiring portion are enhanced.

In this connection, according to the present embodiment, although cavities 604 and 605 are provided adjacent to the via, a configuration may also be adopted in which only the cavities 606 and 607 are formed without providing the cavities 604 and 605. More specifically, the amount of materials to be used can be decreased by affixing a porous membrane member in parts of a region and not in an entire region with respect to some layers, and thus costs can be lowered.

Further, in Embodiments 4 to 6 also, if layers can be electrically connected to each other, the width of wiring in the thickness direction of the layers need not be uniform, and a configuration may be adopted in which the lower part of the wiring is formed in a curved shape as shown in FIG. 21.

The wiring board and wiring board manufacturing method of the present invention have an advantage such that it is possible to suppress spreading of liquid droplets discharged by an ink-jet method, and the present invention is thus useful as a wiring board that has minute wiring lines or the like.

What is claimed is:

1. A wiring board that has a plurality of layers, comprising:
a first wiring pattern that includes electrically conductive nanoparticles as a principal material and is formed in a soluble porous membrane member of any single layer; and
a second wiring pattern that does not include the electrically conductive nanoparticles as a principal material, wherein
a single layer among the plurality of layers is an electrically insulative substrate;
an another single layer among the plurality of layers is a porous membrane member layer that includes the porous membrane member in all or one part of a region of the another single layer;
the first wiring pattern is formed in the porous membrane member layer;
the second wiring pattern is formed on at least any one surface of the substrate;
the wiring board is bent around a bending section; and
the porous membrane member layer is formed using the porous membrane member that is provided at parts excluding a vicinity of the bending section.

2. The wiring board according to claim 1, wherein the porous membrane member layer is disposed on a surface of the substrate or on a surface of a different other single layer among the plurality of layers, on which the second wiring pattern is not formed.

3. The wiring board according to claim 1, wherein the porous membrane member layer is disposed on a surface of the substrate on which the second wiring pattern is formed.

4. The wiring board according to claim 2, wherein:
the porous membrane member layer is disposed on a surface of a different other single layer among the plurality of layers, on which the second wiring pattern is not formed;
a different other single layer among the plurality of layers is formed by a film substrate that is formed with an organic film;
the porous membrane member layer is disposed on one surface of the film substrate;
the substrate is disposed on another surface of the film substrate; and
the second wiring pattern is formed on a surface of the substrate on an opposite side to the film substrate.

5. The wiring board according to claim 3, wherein:
a different other single layer among the plurality of layers is an electrically insulative substrate that is provided adjoining the substrate or is provided in a condition in which one or a plurality of layers are sandwiched between the different other single layer and the substrate; and
a further different other single layer among the plurality of layers is a porous membrane member layer that includes a porous membrane member in all or a part of a region of the further different other single layer;
the wiring board further comprising:
a first wiring pattern formed in a porous membrane member layer that is the further different other single layer; and
a second wiring pattern that is formed in a substrate that is the different other single layer;
wherein the two porous membrane member layers are disposed so as to sandwich the two substrates.

6. The wiring board according to claim 5, wherein, to suppress warpage caused by temperature fluctuations, the two porous membrane member layers include porous membrane members for which coefficients of thermal expansion are different.

7. The wiring board according to claim 1, wherein a different other single layer among the plurality of layers is formed by an ultraviolet-curing resin.

8. The wiring board according to claim 1, wherein all or a part of the first wiring pattern is used as an interlayer connection via that electrically connects wiring patterns formed in two layers that sandwich the porous membrane member layer.

9. The wiring board according to claim 1, wherein the second wiring pattern is formed in a layer such that a surface thereof and a surface of the layer in which the second wiring pattern is formed are positioned on a substantially same plane.

10. The wiring board according to claim 1, wherein the second wiring pattern is formed so that a surface thereof protrudes from a surface of a layer in which the second wiring pattern is formed.

11. The wiring board according to claim 1, wherein the porous membrane member includes polyamide-imide or polyetherimide as a principal component.

12. The wiring board according to claim 1, wherein the electrically conductive nanoparticles are nanoparticles of a material selected from the group consisting of gold, silver, and copper.

13. The wiring board according to claim 1, wherein:
the first wiring pattern has at least a first electrically conductive nanoparticle layer and a second electrically conductive nanoparticle layer;
the first electrically conductive nanoparticle layer occupies all or a part of a thickness direction of the porous membrane member; and
the second electrically conductive nanoparticle layer is positioned on the porous membrane member.

14. A wiring board that has a plurality of layers, comprising:
a first wiring pattern that includes electrically conductive nanoparticles as a principal material and is formed in a soluble porous membrane member of any single layer; and
a second wiring pattern that does not include the electrically conductive nanoparticles as a principal material, wherein
a single layer among the plurality of layers is an electrically insulative substrate;
an another single layer among the plurality of layers is a porous membrane member layer that includes the porous membrane member in all or one part of a region of the another single layer;
the first wiring pattern is formed in the porous membrane member layer;
the second wiring pattern is formed on at least any one surface of the substrate;
a predetermined number of layers that are adjacently disposed among the plurality of layers are the porous membrane member layer;
at least one part of wiring portions of first wiring patterns in the predetermined number of porous membrane member layers that are adjacently disposed are formed so that centers in a width direction of the wiring portions are positioned on a substantially same straight line;
widths of the wiring portions between the porous membrane member layers that are adjacent are formed so as to be substantially the same or to become larger in a direction from a first predetermined porous membrane member layer towards a second predetermined porous membrane member layer among the predetermined number of porous membrane member layers;
a width of the wiring portion that is formed in a third predetermined porous membrane member layer that is disposed adjoining a surface opposite the first predetermined porous membrane member layer side of the second predetermined porous membrane member layer is not more than a width of the wiring portion formed in the first predetermined porous membrane member layer; and
widths of the wiring portions between the porous membrane member layers that are adjoining are formed so as to be substantially the same or to become larger in a direction from the third predetermined porous membrane member layer towards a fourth predetermined porous membrane member layer that is disposed on an opposite side to the second predetermined porous membrane member layer.

15. The wiring board according to claim 14, wherein a cavity is formed in at least any one porous membrane member layer among the predetermined number of porous membrane members.

16. The wiring board according to claim 15, wherein the cavity is formed adjacent to one part of wiring portions of the first wiring pattern.

17. The wiring board according to claim 16, wherein:
at least one part of wiring portions of a first wiring pattern in the predetermined number of porous membrane member layers that are adjacently disposed are formed so that centers in a width direction of the wiring portions are positioned on a substantially same straight line;
the one part of wiring portions of the first wiring pattern to which the cavity is adjacent is the one part of wiring portions of a first wiring pattern that are formed so that centers in the width direction are positioned on a substantially same straight line;
a width of the wiring portions to which the cavity is adjacent is smaller than a width of the wiring portion formed in at least one porous membrane member layer that is adjacent to a porous membrane member layer in which the cavity is formed; and
the cavity is also adjacent to the wiring portion formed in the at least one porous membrane member layer that is adjacent.

18. The wiring board according to claim 14, wherein the second wiring pattern is formed in a layer such that a surface thereof and a surface of the layer in which the second wiring pattern is formed are positioned on a substantially same plane.

19. The wiring board according to claim 14, wherein the second wiring pattern is formed so that a surface thereof protrudes from a surface of a layer in which the second wiring pattern is formed.

20. The wiring board according to claim 14, wherein the porous membrane member includes polyamide-imide or polyetherimide as a principal component.

21. The wiring board according to claim 14, wherein the electrically conductive nanoparticles are nanoparticles of a material selected from the group consisting of gold, silver, and copper.

22. The wiring board according to claim 14, wherein:
the first wiring pattern has at least a first electrically conductive nanoparticle layer and a second electrically conductive nanoparticle layer;
the first electrically conductive nanoparticle layer occupies all or a part of a thickness direction of the porous membrane member; and
the second electrically conductive nanoparticle layer is positioned on the porous membrane member.

* * * * *